(12) United States Patent
Matsubara et al.

(10) Patent No.: US 10,418,323 B2
(45) Date of Patent: Sep. 17, 2019

(54) SEMICONDUCTOR DEVICE AND MANUFACTURING METHOD THEREOF

(71) Applicant: Renesas Electronics Corporation, Tokyo (JP)

(72) Inventors: Yoshihisa Matsubara, Ibaraki (JP); Takashi Ishigami, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/994,263

(22) Filed: Jan. 13, 2016

(65) Prior Publication Data

US 2016/0218060 A1 Jul. 28, 2016

(30) Foreign Application Priority Data

Jan. 28, 2015 (JP) ................. 2015-013970

(51) Int. Cl.
*H01L 23/528* (2006.01)
*H01L 23/482* (2006.01)
*H01L 23/00* (2006.01)
*H01L 29/66* (2006.01)

(52) U.S. Cl.
CPC ........ *H01L 23/528* (2013.01); *H01L 23/4824* (2013.01); *H01L 23/5286* (2013.01); *H01L 24/00* (2013.01); *H01L 29/66795* (2013.01); *H01L 2224/05624* (2013.01); *H01L 2224/45147* (2013.01); *H01L 2924/0002* (2013.01)

(58) Field of Classification Search
None
See application file for complete search history.

(56) References Cited

U.S. PATENT DOCUMENTS

| 5,060,050 A | 10/1991 | Tsuneoka et al. |
| 6,717,270 B1 * | 4/2004 | Downey ................. H01L 23/50 |
| | | 257/758 |
| 6,822,329 B2 * | 11/2004 | Varrot .................... H01L 24/03 |
| | | 257/508 |

(Continued)

FOREIGN PATENT DOCUMENTS

| JP | 6425439 A | 1/1989 |
| JP | 2005072172 A | 3/2005 |

(Continued)

OTHER PUBLICATIONS

Communication dated Jul. 31, 2018, from the Japanese Patent Office in counterpart application No. 2015-013970.

*Primary Examiner* — Hoang-Quan T Ho

(74) *Attorney, Agent, or Firm* — McDermott Will & Emery LLP

(57) ABSTRACT

An improvement is achieved in the performance of a semiconductor-device. The semiconductor device includes MISFETs formed in the upper surface of a substrate, a plurality of wiring layers stacked over the upper surface of the substrate, and a plurality of plugs each coupling two of the wiring layers to each other. The wiring layers located under the uppermost wiring layer include wires. The uppermost wiring layer includes a pad, an insulating film formed over the pad, and an opening extending through the insulating film and reaching the pad. The MISFETs and the wires overlap the opening in plan view. None of the plurality of plugs overlaps the opening in plan view.

9 Claims, 24 Drawing Sheets

(56) References Cited

U.S. PATENT DOCUMENTS

| | | | |
|---|---|---|---|
| 7,629,689 B2 | 12/2009 | Maeda | |
| 8,614,513 B2 | 12/2013 | Yuzawa et al. | |
| 9,620,502 B2 | 4/2017 | Jeon et al. | |
| 2005/0161835 A1* | 7/2005 | Maeda | H01L 22/32 257/786 |
| 2006/0097406 A1* | 5/2006 | Wu | H01L 24/05 257/784 |
| 2006/0103031 A1* | 5/2006 | Wu | H01L 23/5223 257/781 |
| 2006/0226547 A1* | 10/2006 | Wang | H01L 24/05 257/758 |
| 2007/0215948 A1* | 9/2007 | Yang | H01L 27/0255 257/355 |
| 2008/0042292 A1* | 2/2008 | Adkisson | H01L 23/562 257/773 |
| 2008/0237866 A1* | 10/2008 | Wang | H01L 23/3192 257/753 |
| 2008/0258262 A1* | 10/2008 | Nagai | H01L 21/76826 257/535 |
| 2009/0184424 A1 | 7/2009 | Furusawa et al. | |
| 2010/0314620 A1* | 12/2010 | Furusawa | H01L 21/768 257/48 |
| 2012/0153444 A1 | 6/2012 | Haga et al. | |
| 2016/0035672 A1* | 2/2016 | Funaya | H01L 27/0688 257/531 |

FOREIGN PATENT DOCUMENTS

| | | | |
|---|---|---|---|
| JP | 2005236277 A | 9/2005 | |
| JP | 2006523036 A | 10/2006 | |
| JP | 2007300020 A | 11/2007 | |
| JP | 2009-170763 A | 7/2009 | |
| JP | 2014207445 A | 10/2014 | |
| WO | 2010147187 A1 | 12/2010 | |

* cited by examiner

SEMICONDUCTOR DEVICE AND MANUFACTURING METHOD THEREOF

CROSS-REFERENCE TO RELATED APPLICATIONS

The disclosure of Japanese Patent Application No. 2015-013970 filed on Jan. 28, 2015 including the specification, drawings and abstract is incorporated herein by reference in its entirety.

BACKGROUND

The present invention relates to a semiconductor device and a manufacturing method thereof, which can be used appropriately as a semiconductor device including semiconductor elements formed in a semiconductor substrate and a manufacturing method thereof.

There is a semiconductor chip as a semiconductor device which has semiconductor elements formed in the upper surface of a semiconductor substrate and a plurality of wiring layers formed over the upper surface of the semiconductor substrate. There is also a semiconductor chip as a semiconductor device in which the uppermost one of a plurality of wiring layers includes a pad for electrically coupling the semiconductor chip to the outside of the semiconductor chip. In recent years, to reduce the area occupied by a semiconductor chip, any of a plurality of semiconductor elements or any of the plurality of wires included in each of wiring layers is placed immediately under a pad.

Japanese Unexamined Patent Publication No. 2009-170763 (Patent Document 1) discloses a technique related to semiconductor device including a plurality of wiring layers formed over a first main surface of a semiconductor substrate and coupling portions which electrically couple the plurality of wiring layers to each other.

RELATED ART DOCUMENT

Patent Document

[Patent Document 1]
Japanese Unexamined Patent Publication No. 2009-170763

SUMMARY

As the semiconductor device in which any of the plurality of semiconductor elements or any of the plurality of wires included in each of the wiring layers is placed immediately under the pad described above, there is a semiconductor device in which any of a plurality of plugs coupling different two wiring layers to each other is placed immediately under a pad.

In such a case, when bonding wires are bonded to the pad, a large stress is applied to the plug formed immediately under the pad. As a result, the plug is more likely to be deformed and a defect is more likely to occur in the coupling between the different two wiring layers. Accordingly, the performance of the semiconductor device cannot be improved.

Other problems and novel features of the present invention will become apparent from a statement in the present specification and the accompanying drawings.

According to an embodiment, a semiconductor device includes a semiconductor element formed in a main surface of a semiconductor substrate, a plurality of wring layers stacked over the main surface of the semiconductor substrate, and a plurality of first coupling electrodes each of which couples different two of the wiring layers to each other. The one of the wiring layers which is located under the uppermost wiring layer includes a first wire. The uppermost one of the wiring layers includes an electrode terminal, an insulating film formed over the electrode terminal, and an opening extending through the insulating film and reaching the electrode terminal. The semiconductor element and the first wire overlap the opening in plan view. None of the first coupling electrodes overlaps the opening in plan view.

According to another embodiment, a method of manufacturing a semiconductor device includes the steps of forming a semiconductor element in a main surface of a semiconductor substrate, forming a plurality of wiring layers stacked over the main surface of the semiconductor substrate, and forming a plurality of first coupling electrodes each of which couples different two of the wiring layers to each other. The step of forming the wiring layers includes the steps of forming the one of the wiring layers which is located under the uppermost wiring layer and then forming the uppermost one of the wiring layers. The one the wiring which is located under the uppermost wiring layer includes a first wire. The step of forming the uppermost one of the wiring layers includes the steps of forming an electrode terminal, forming an insulating film over the electrode terminal, and forming an opening extending through the insulating film and reaching the electrode terminal. The semiconductor element and the first wire overlap the opening in plan view. None of the first coupling electrodes overlaps the opening in plan view.

According to the embodiment, the performance of the semiconductor device can be improved.

DETAILED DESCRIPTION

Figure 1:
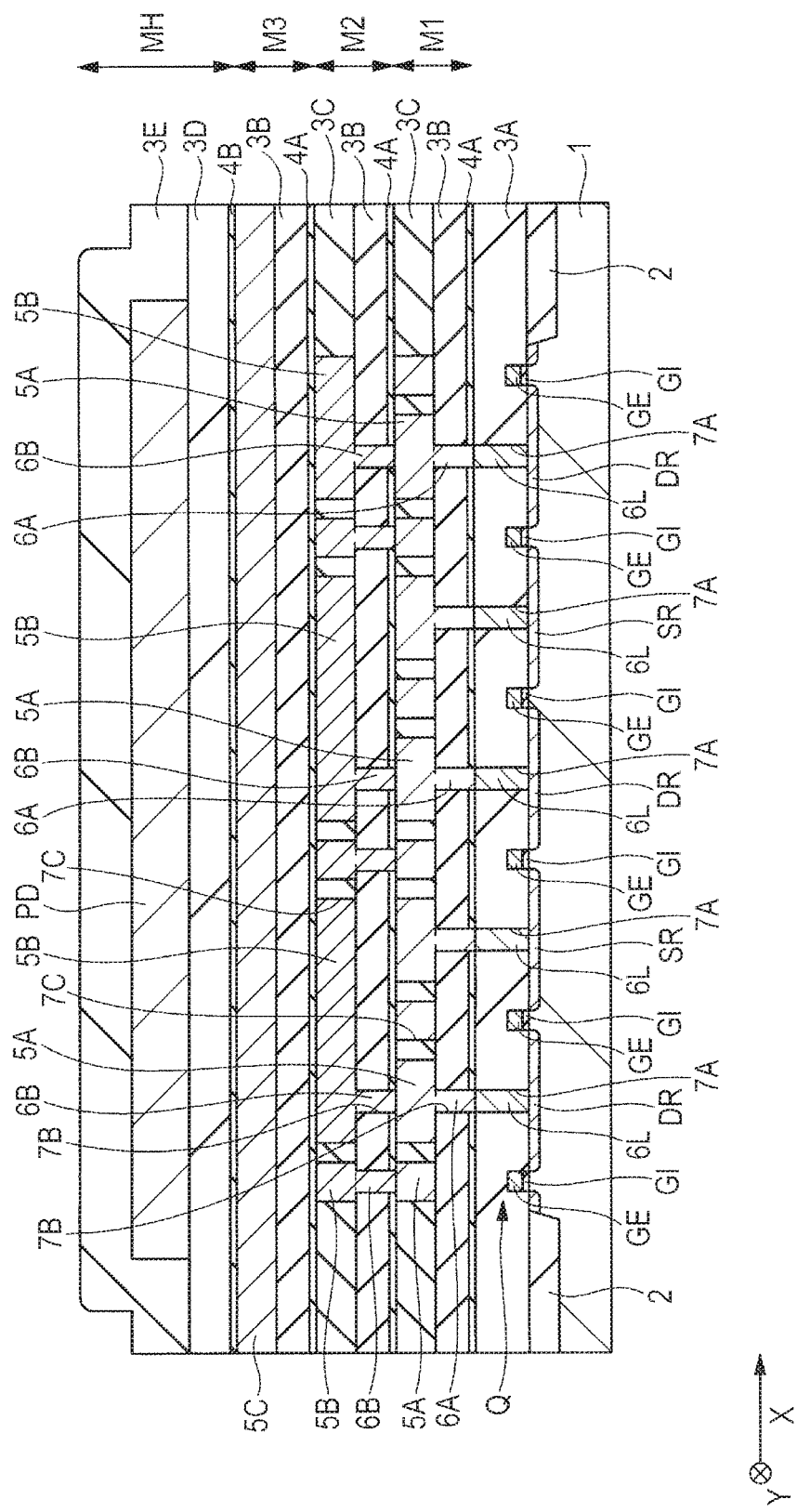
FIG. 1 is a main-portion cross-sectional view of a semiconductor chip in a semiconductor device in Embodiment 1.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others.

Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers.

Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the representative embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration.

Note that, when a range is shown as "A-B" in the following embodiments, it is assumed that "A-B" represents "not less than A and not more than B" unless particularly explicitly described otherwise.

(Embodiment 1)

<Structure of Semiconductor Device>

First, a structure of a semiconductor device in Embodiment 1 will be described with reference to the drawings.

Figure 2:
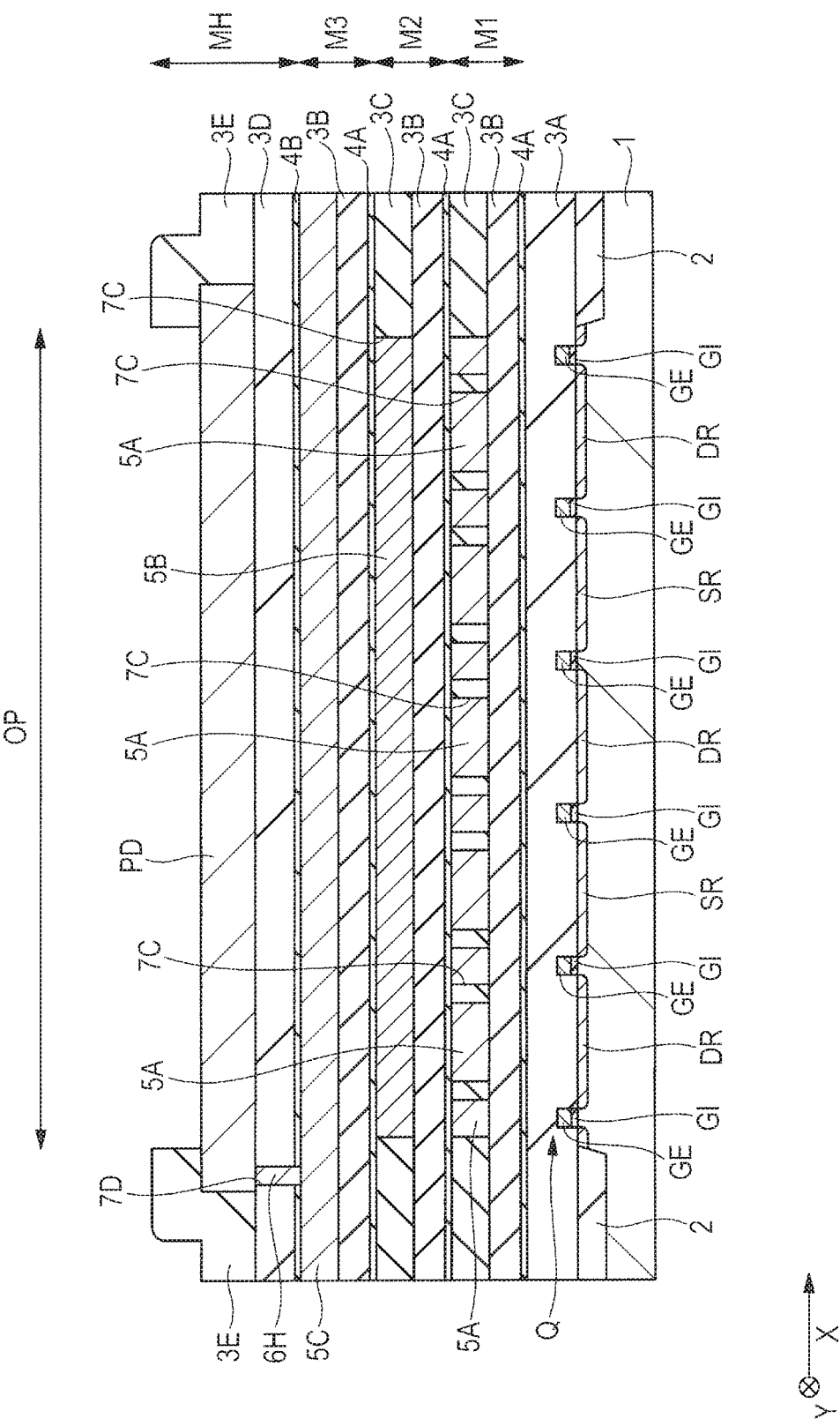
FIG. 2 is a main-portion cross-sectional view of the semiconductor chip in the semiconductor device in Embodiment 1.
Figure 3:
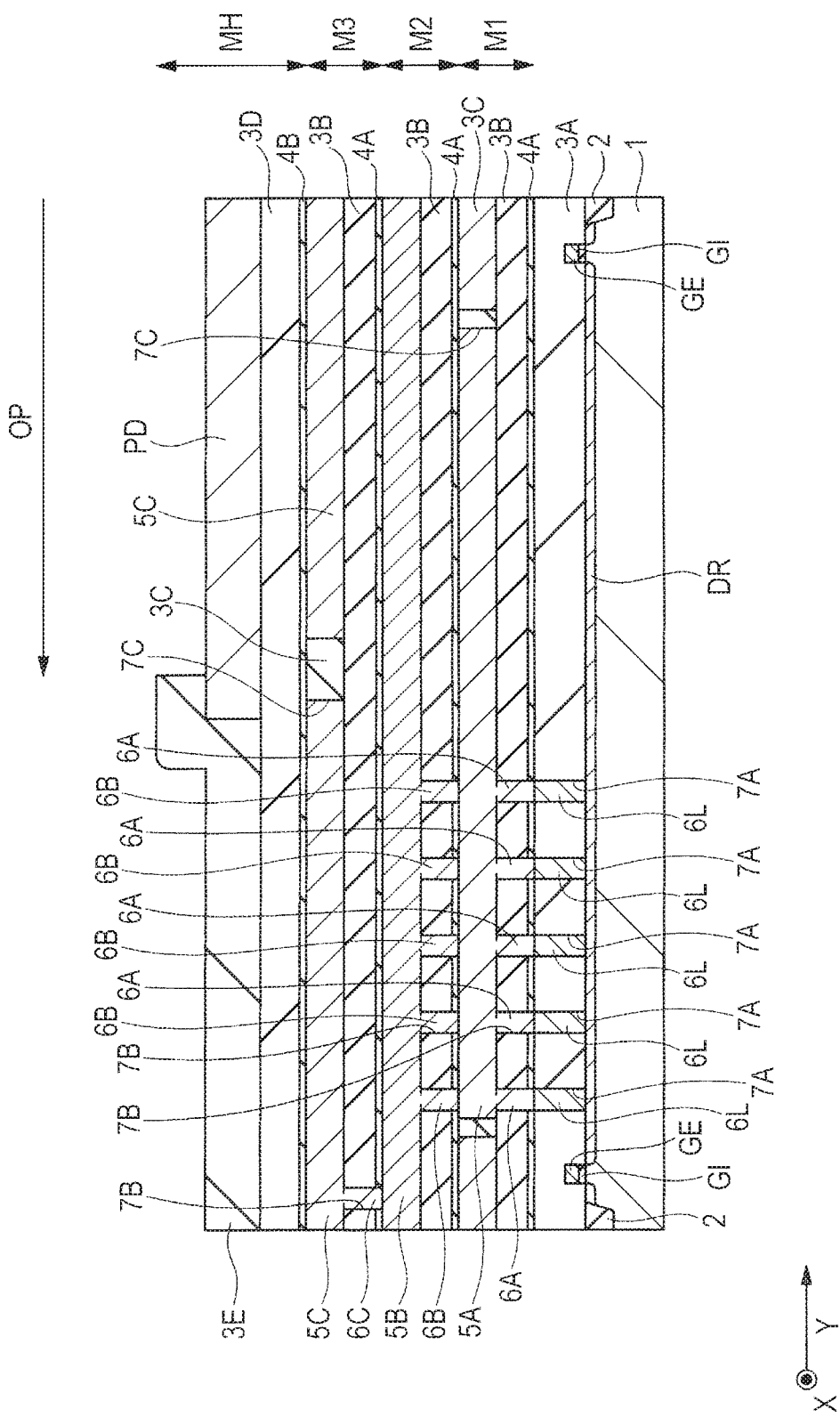
FIG. 3 is a main-portion cross-sectional view of the semiconductor chip in the semiconductor device in Embodiment 1.

FIGS. 1 to 3 are main-portion cross-sectional views of a semiconductor chip in a semiconductor device in Embodiment 1. FIGS. 4 to 8 are main-portion plan views of the semiconductor chip in the semiconductor device in Embodiment 1. FIG. 1 is a cross-sectional view along the line A-A in each of FIGS. 4 to 8. FIG. 2 is a cross-sectional view along the line B-B in each of FIGS. 4 to 8. FIG. 3 is a cross-sectional view along the line C-C in each of FIGS. 4 to 8.

Figure 4:
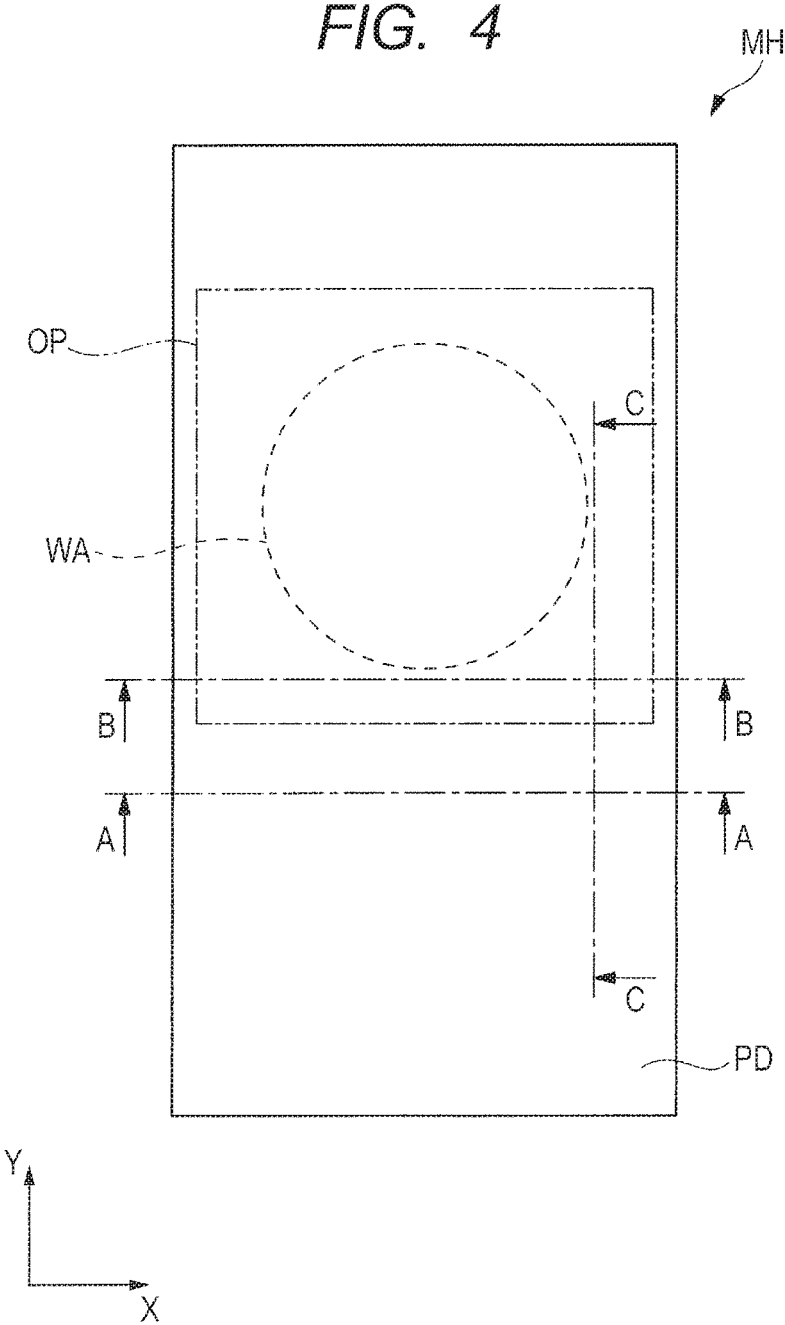
FIG. 4 is a main-portion plan view at the semiconductor chip in the semiconductor device in Embodiment 1.
Figure 5:
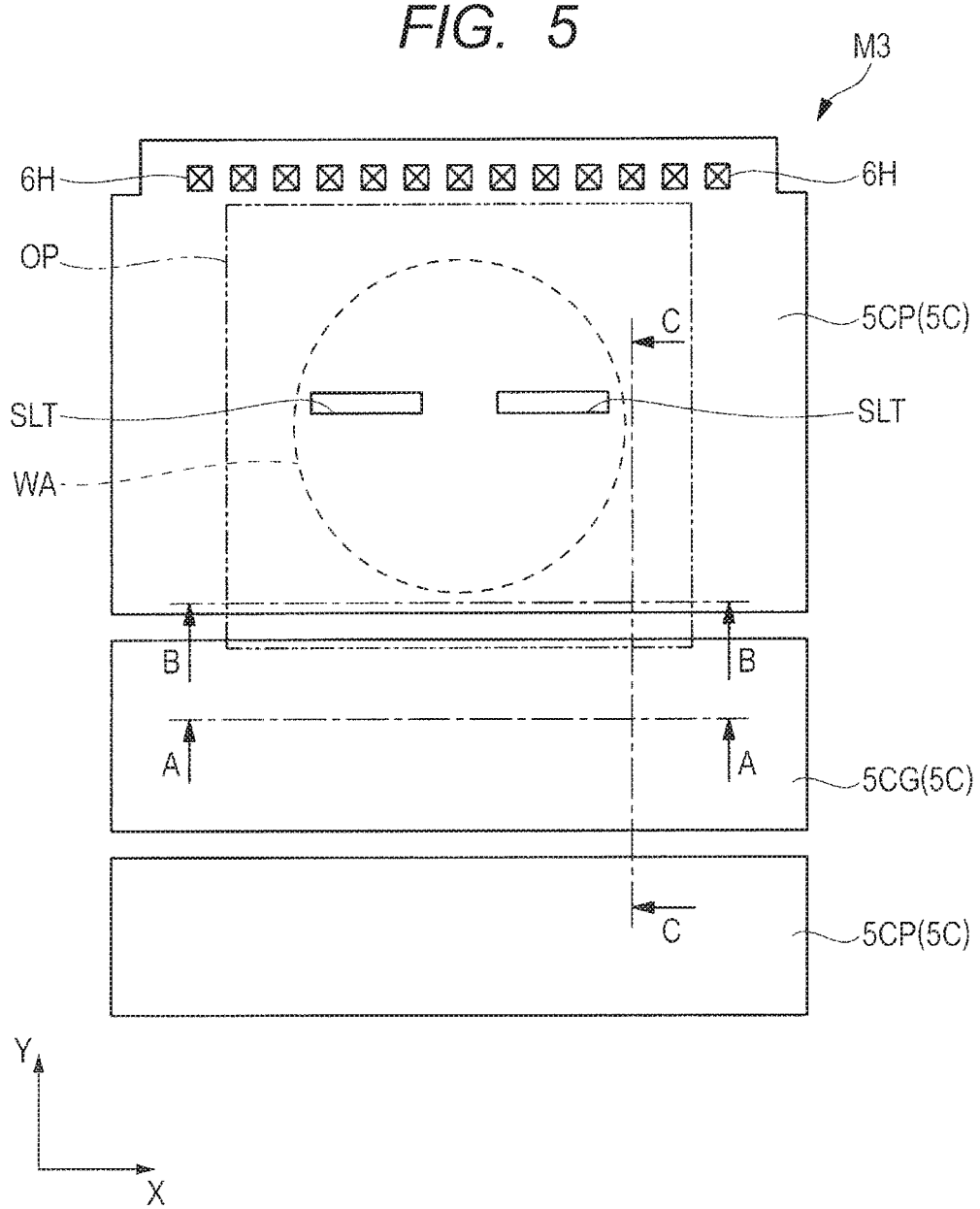
FIG. 5 is a main-portion plan view of the semiconductor chip in the semiconductor device in Embodiment 1.
Figure 6:
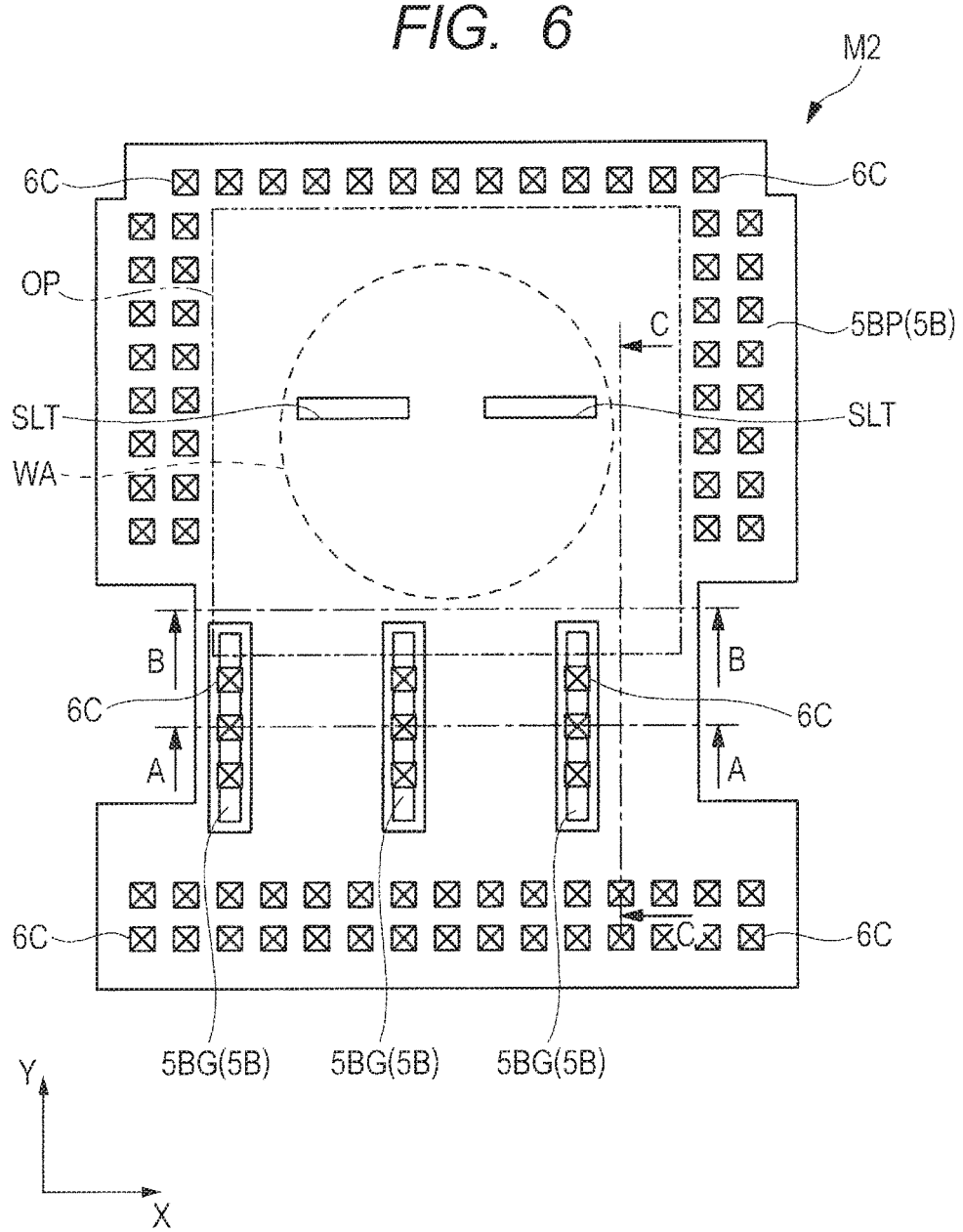
FIG. 6 is a main-portion plan view of the semiconductor chip in the semiconductor device in Embodiment 1.
Figure 7:
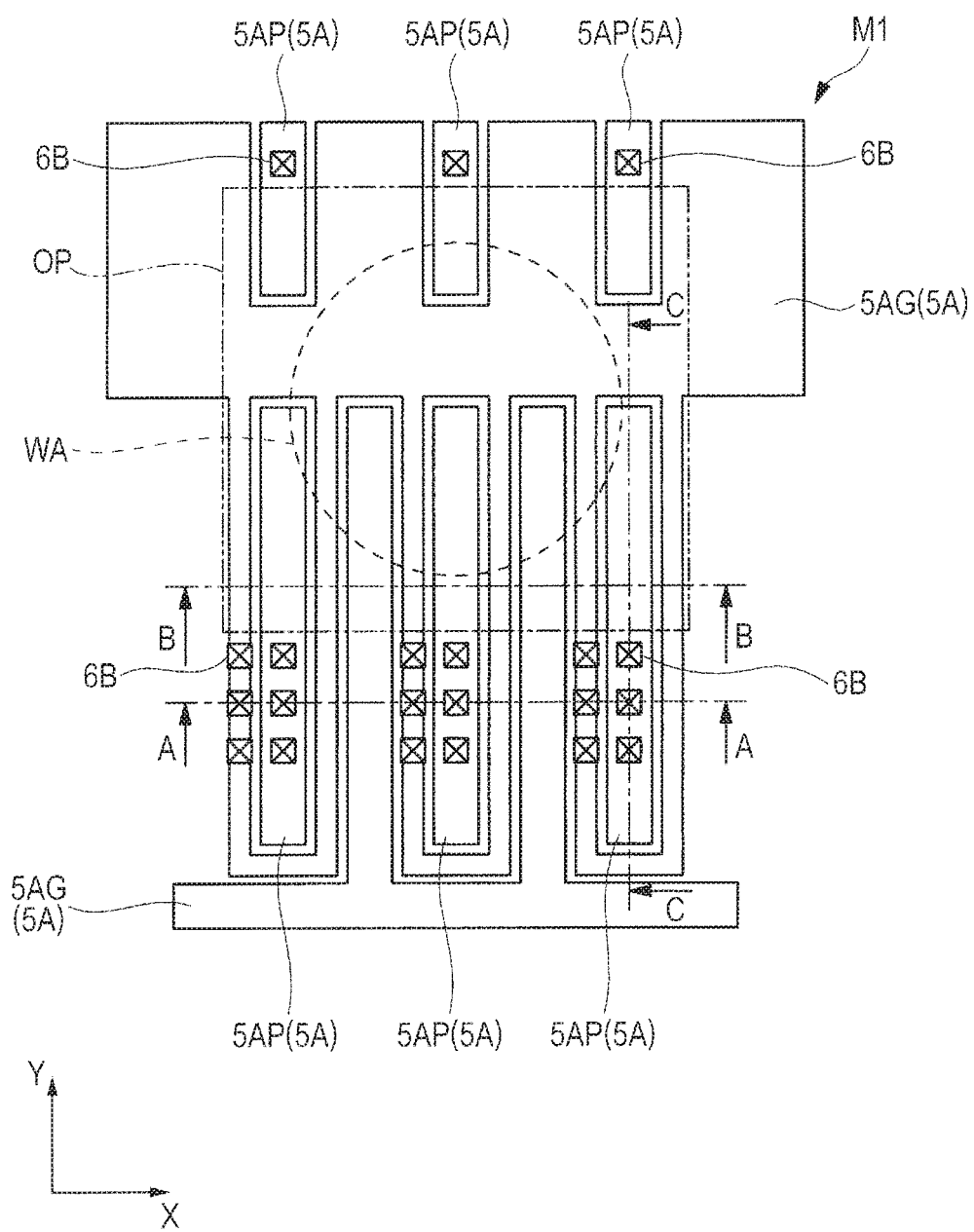
FIG. 7 is a main-portion plan view at the semiconductor chip in the semiconductor device in Embodiment 1.
Figure 8:
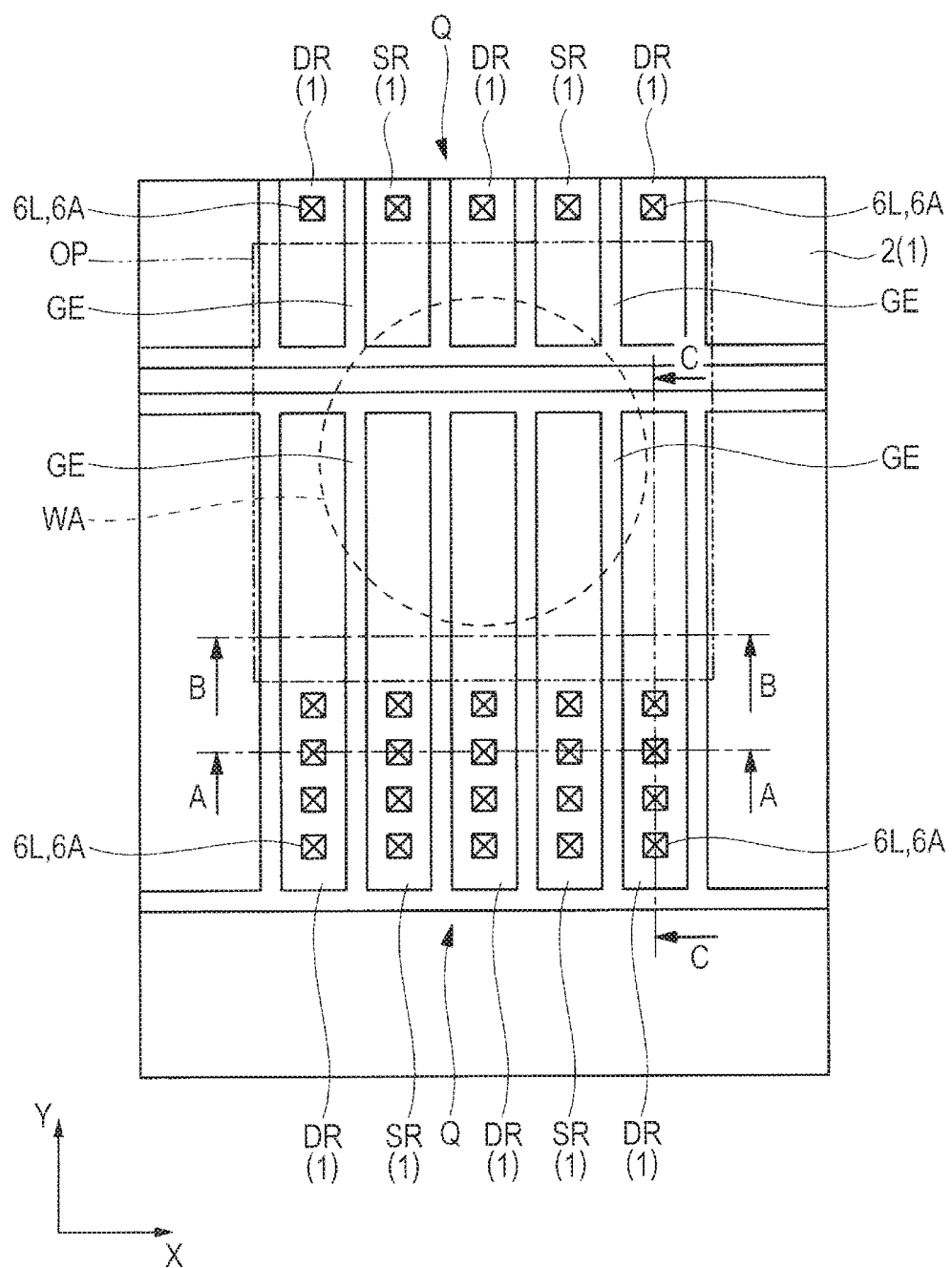
FIG. 8 is a main-portion plan view of the semiconductor chip in the semiconductor device in Embodiment 1.

FIG. 4 shows an example of the layout of a pad PD included in a wiring layer MH in the vicinity of an opening OP. FIG. 5 shows an example of the layout of wires 5C included in a wiring layer M3 in the vicinity of the opening OP. FIG. 6 shows an example of the layout of wires 5B included in a wiring layer M2 in the vicinity of the opening OP. FIG. 7 shows an example of the layout of wires 5A included in a wiring layer M1 in the vicinity of the opening OP. FIG. 8 shows an example of the layout of MISFETs Q in the vicinity of the opening OP. In each of FIGS. 4 to 8, the position of the opening OP is shown by the two-dot-dash line and the position of a wire bonding region WA is shown by the broken line.

As shown in FIGS. 1 to 3, the semiconductor chip has a substrate 1 as a semiconductor substrate. The substrate 1 is made of, e.g., a p-type silicon (Si) single crystal. In the upper surface as a main surface of the substrate 1, e.g., a trench-type isolation portion 2 is formed. The trench-type isolation portion 2 is formed of an insulating film made of, e.g., silicon dioxide ($SiO_2$) and embedded in the trench formed in the upper surface of the substrate 1.

In the active region surrounded by the isolation portion 2, semiconductor elements such as field effect transistors (hereinafter referred to as MISFETs (Metal Insulator Semiconductor Field Effect Transistors)) Q represented by, e.g., MOSFETs (Metal Oxide Semiconductor Field Effect Transistors) are formed. That is, the MISFETs Q as the semiconductor elements are formed in the upper surface as the main surface of the substrate 1.

As shown in FIGS. 1 to 3, each of the MISFETs Q includes a pair of source/drain semiconductor regions formed in the upper surface of the substrate 1, a gate insulating film GI formed over the upper surface of the substrate 1 between the pair of semiconductor regions, and a gate electrode GE formed over the gate insulating film GI.

The gate insulating film GI is made of, e.g., silicon dioxide (SiO$_2$). The gate electrode GE is made of, e.g., polysilicon.

In Embodiment 1, as shown in FIGS. 4 and 8, the plurality of MISFETs Q are arranged so as to overlap the portion of the pad PD which is exposed from the opening OP. Note that the plurality of MISFETs Q are arranged even in the portion of the upper surface of the substrate 1 other than the portion thereof overlapping the portion of the pad PD which is exposed from the opening OP in plan view, though the illustration thereof is omitted in FIGS. 1 to 8.

As shown in FIGS. 1, 2, and 8, it is assumed that the gate length direction of the gate electrode GE included in each of the MISFETs Q arranged so as to overlap the portion of the pad PD which is exposed from the opening OP is an X-axis direction and the gate width direction of the gate electrode GE included in the MISFET Q is a Y-axis direction.

Note that, by way of example, the following will describe the case where each of the MISFETs Q is an n-channel field effect transistor including the source region SR and the drain region DR as the semiconductor regions.

As shown in FIGS. 1 to 3, over the upper surface of the substrate 1, e.g., four wiring layers are stacked via an insulating film 3A. These wiring layers include wiring layers M1, M2, and M3 and an uppermost wiring layer PH located thereover. That is, the wiring layers M1, M2, and M3 are those of the plurality of wiring layers which are located under the uppermost layer. The wiring layer M1 is the lowermost one of the plurality of wiring layers. Note that the number of the wiring layers is not limited thereto but can variously be changed.

The insulating film 3A is deposited over the upper surface of the substrate 1. The insulating film 3A is made of, e.g., silicon dioxide (SiO$_2$).

In the insulating film 3A, a plurality of plugs 6L are formed to extend from the upper surface of the insulating film 3A to the lower surface thereof through the insulating film 3A. Each of the plurality of plugs 6L is a coupling electrode made of a conductor film embedded in a contact hole 7A formed in the insulating film 3A, i.e., a via. Each of the plurality of plugs 6L electrically couples the MISFET Q to the wiring layer M1. That is, the wiring layer M1 is electrically coupled to the MISFETs Q via the plugs 6L. Each of the plurality of plugs 6L electrically couples the wiring layer M1 to the source region. SR or the drain region DR.

The conductor film forming each of the plugs 6L includes a main wiring member and a barrier metal film, though the illustration thereof is omitted in FIGS. 1 to 3. The main wiring member is made of a refractory metal such as, e.g., tungsten (W). The barrier metal is provided between the main wiring member and the insulating film along the outer periphery thereof (closer to the side and bottom surfaces thereof), while being in contact with each of the members. The barrier metal film has the function of triggering the growth of tungsten and the function of improving the adhesion between the main wiring member and the insulating film. The barrier metal film is formed to have a thickness smaller than that of the main wiring member and made of, e.g., titanium nitride (TiN).

In Embodiment 1, the MISFETs Q are coupled to the wiring layer M1 by the plurality of plugs 6L each having a circular or quadrilateral shape in plan view. That is, each of the plurality of plugs 6L has a cylindrical or prismatic shape.

The wiring layer M1 includes insulating films 4A, 3B, and 3C and the wires 5A as a conductor pattern. The insulating films 4A, 3B, and 3C included in the wiring layer M1 are deposited upwardly in this order over the insulating film 3A.

Between the wires 5A included in the wiring layer M1 and the plugs 6L, plugs 6A are formed as vias. That is, the plugs 6A are coupling electrodes which electrically couple the plugs 6L formed in the insulating film 3A to the wiring layer M1.

For example, the insulating film 4A is made of silicon carbonitride (SiCN) and has the function of an etching stopper when the insulating films 3B and 3C are etched. The insulating film 3B has the function of insulating the adjacent two plugs 6A from each other. The insulating film 3C has the function of insulating the adjacent two wires 5A from each other.

The insulating film 3B includes a single-layer film. The single-layer film included in the insulating film 3B is made of a low-dielectric-constant film, i.e., a Low-k film. Here, the low-dielectric-constant film, i.e., Low-k film means an insulating film having a relative permittivity lower than that of silicon dioxide (SiO$_2$). Specific examples of the material of the insulating film 3B include carbon-containing silicon oxide (SiOC).

The insulating film 3C includes a lower-layer insulating film and an upper-layer insulating film formed over the lower-layer insulating film, though the illustration thereof is omitted in FIGS. 1 to 3. The lower-layer insulating film included in the insulating film 3C is made of a low-dielectric-constant film. The upper-layer insulating film included in the insulating film 3C is made of, e.g., silicon dioxide or carbon-containing silicon oxide (SiOC).

The wires 5A are made of a conductor film embedded in wire trenches 7C formed in the insulating film 3C included in the wiring layer M1. The plugs 6A are made of a conductor film embedded in through holes 7B formed in the insulating film 31B exposed at the bottom portions of the wire trenches 7C formed in the wiring layer M1 and in the insulating film 4A under the insulating film 3B.

In Embodiment 1, the wires and the plugs 6A are integrally formed. That is, the wires 5A and the plugs 6A are each made of the conductor film embedded integrally in the wire trenches 7C extending through the insulating film 3C included in the wiring layer M1 and reaching the insulating film 3B and in the through holes 7B extending through the insulating film 3B exposed at the bottom portions of the wire trenches 70 and through the insulating film 4A under the insulating film 3B and reaching the plugs 6L. Such wires and plugs each made of a conductor film embedded integrally in wire trenches and in through holes are referred to as dual damascene wires. The conductor film included in each of the wires 5A and the plugs 6A includes a main wiring member and a barrier metal film, though. the illustration thereof is omitted in FIGS. 1 to 3.

It may also he possible that wires made of, e.g., aluminum. (Al) are formed over the lower wiring layer, an insulating film is formed over the lower wiring layer so as to cover the wires, and plugs are formed over the wires to extend from the upper surface of the insulating film and reach the upper surfaces of the wires through the insulating film.

The main wiring member included in each of the wires 5A and the plugs 6A is made of a metal such as, e.g., copper (Cu). To the main wiring member, e.g., aluminum, silver (Ag), or tin (Sn) may be added to prevent migration.

When the main wiring member included in each of the wires 5A and the plugs 6A is made of copper, the wires 5A and the plugs 6A contain copper as a main component. Containing copper as a main component means that the weight ratio of copper in each of the wires 5A and the plugs 6A is higher than 50%.

The barrier metal film included in each of the wires 5A and the plugs 6A is provided between the main wiring member and the insulating film along the outer periphery thereof (closer the side and bottom surfaces thereof), while being in contact with each of the members. The barrier metal film has the function of inhibiting or preventing the diffusion of copper in the main wiring member and the function of improving the adhesion between the main wiring member and the insulating film. The barrier metal film is thinner than the main wiring member and made of a laminated film including, e.g., a tantalum nitride (TaN) film and a tantalum (Ta) film over the tantalum nitride film. The tantalum nitride film is in contact with the insulating film, while the tantalum film is in contact with the main wiring member.

The wiring layer M2 includes the insulating films 4A, 3B, and 3C and the wires 5B as the conductor pattern. The insulating films 4A, 3B, and 3C included in the wiring layer M2 are deposited upwardly in this order over the insulating film 3C included in the wiring layer M1. Between the wires 5B included in the wiring layer M2 and the wires 5A included in the wiring layer M1, plugs 6B are formed as vias. That is, the plugs 6B are coupling electrodes which electrically couple the wiring layers M1 and M2 as different two of the plurality of wiring layers to each other.

The configurations and functions of the insulating films 4A, 3B, and 3C included in the wiring layer M2 are the same as the configurations and function of the insulating films 4A, 3B, and 3C included in the wiring layer M1.

The wires 5B are made of a conductor film embedded in the wire trenches 7C formed in the insulating film 3C included in the wiring layer M2. The plugs 6B are made of a conductor film embedded in the through holes 7B formed in the insulating film 3B exposed at the bottom portions of the wire trenches 7C formed in the wiring layer M2 and in the insulating film 4A under the insulating film 3B.

In Embodiment 1, the wires 5B and the plugs 6B are integrally formed. That is, the wires 5B and the plugs 6B are each made of the conductor film embedded integrally in the wire trenches 7C extending through the insulating film 3B included in the wiring layer M2 and reaching the insulating film 3B and in the through holes 7B extending through the insulating film 3B exposed at the bottom portions of the wire trenches 7C and through the insulating film 4A under the insulating film 3B and reaching the wires 5A. The conductor film included in each of the wires 5B and the plugs 6B includes a main wiring member and a barrier metal film similarly to the conductor film included in each of the wires 5A and the plugs 6A, though the illustration thereof is omitted in FIGS. 1 to 3. The main wiring member included in each of the wires 5B and the plugs 6B is made of, e.g., copper (Cu).

The wiring layer M3 includes the insulating films 4A, 3B, and 3C (see FIG. 3) and the wires 5C as the conductor pattern. The insulating films 4A, 3B, and 3C included in the wiring layer M3 are deposited upwardly in this order over the insulating film 3C included in the wiring layer M2. Between the wires 5C included in the wiring layer M3 and the wires 5B included in the wiring layer M2, plugs 6C (see FIG. 3) are formed as vias. That is, the plugs 6C are coupling electrodes which electrically couple the wiring layers M2 and M3 as different two of the plurality of wiring layers to each other.

The configurations and functions of the insulating films 4A, 3B, and 3C included in the wiring layer M3 are the same as the configurations and functions of the insulating films 4A, 31B, and 3C included in the wiring layer M1.

The wires 5C are made of a conductor film embedded in the wire trenches 7C formed in the insulating film 3C included in the wiring layer M3. The plugs 6C are made of a conductor film embedded in the through holes 7B formed in the insulating film 3B exposed at the bottom portions of the wire trenches 7C formed in the wiring layer M3 and in the insulating film 4A under the insulating film 3B.

In Embodiment 1, the wires 5C and the plugs 6C are integrally formed. That is, the wires 5C and the plugs 6C are made of the conductor film embedded integrally in the wire trenches 7C extending though the insulating film 3C included in the wiring layer M3 and reaching the insulating film 3B and in the through holes 7B extending through the insulating film 3B exposed at the bottom portions of the wire trenches 7C and through the insulating film 4A under the insulating film 3B and reaching the wires 5B. The conductor film included in each of the wires 5C and the plugs 6C includes a main wiring member and a barrier metal film similarly to the conductor film included in each of the wires 5A and the plugs 6A, though the illustration thereof is omitted in FIGS. 1 to 3. The main wiring member included in each of the wires 5C and the plugs 6C is made of, e.g., copper (Cu).

The uppermost wiring layer MH includes insulating films 4B, 3D, and 3E, the pad PD as an electrode terminal, and plugs 6H as the coupling electrodes (see FIG. 2). The insulating films 4B, 3D, and 3E included in the uppermost wiring layer MH are deposited upwardly in this order over the insulating film 3C included in the wiring layer M3. Note that the uppermost wiring layer MR may also include wires other than the pad PD and made of a conductor film formed in the same layer as that of the conductor film included in the pad PD.

The configuration and function of the insulating film 4B are the same as the configuration and function of the insulating film 4A included in each of the wiring layers M1 to M3.

The insulating film 3D is made of, e.g., silicon dioxide. The insulating film 3D has the function of insulating the adjacent two plugs 6H from each other.

Over the insulating film 3D, the pad PD is formed. The pad PD is formed by patterning a conductor film by a photolithographic process and a dry etching process. The conductor film included in the pad PD includes a main wiring member and relatively thin barrier metal films formed over the upper and lower surfaces of the main wiring member, though the illustration thereof is omitted in FIGS. 1 to 3. At this time, the uppermost-layer barrier metal film of the portion of the pad PD which is exposed from the opening OP may also be removed to expose the main wiring member.

The main wiring member is made of, e.g., aluminum. To the main wiring member, e.g., silicon or copper may also be added to prevent migration or the like. When the main wiring member included in the pad PD is made of aluminum, the pad PD contains aluminum as a main component.

The barrier metal film formed over the lower surface of the main wiring member has the function of inhibiting a reaction between, e.g., aluminum as the material of the main wiring member and lower-layer wires and the function of improving the adhesion between the pad PD and the insulating film 3D. The barrier metal film formed over the lower surface of the main wiring member is made of a laminated film including, e.g., titanium film, a titanium nitride film over the titanium film, and a titanium film over the titanium nitride film.

On the other hand, the barrier metal film formed over the upper surface of the math wiring member has the function of improving the adhesion between the pad PD and the insulating film 3E and the function of an antireflection film during exposure in the photolithographic process. The barrier metal film formed over the upper surface of the main wiring member is made of, e.g., a titanium nitride film.

Over the insulating film 3D, the insulating film 3E is formed so as to cover the top surface of the pad PD. That is, the insulating film 3E is formed over the pad PD.

The insulating film It is made of a laminated body including, e.g., a silicon dioxide film, a silicon nitride film deposited over the silicon dioxide film, and a polyimide resin film deposited over the silicon nitride film. The insulating film 3E has the function of insulating the pad PD and wires (the illustration of which is omitted) other than the pad PD and made of a conductor film formed in the same layer as that of the conductor film included in the pad PD. The insulating film 3E also has the function of protecting the top surface of the pad PD and the top surfaces of the wires (the illustration of which is omitted) other than the pad and made of the conductor film formed in the same layer as that of the conductor film included in the pad PD. That is, the top surface of the pad PD and the top surfaces of the wires (the illustration of which is omitted) other than the pad PD and made of the conductor film formed in the same layer as that of the conductor film included in the pad PD are covered with the insulating film 3E.

In the insulating film 3E, the opening OP (see FIGS. 2 and 3) is formed so as to expose a part of the upper surface of the pad PD. That is, the opening OP extends through the insulating film 3E and reaches the upper surface of the pad PD. Of the upper surface of the pad PD, the region exposed in the opening OP is the region where copper (Cu) wires as bonding wires are allowed to come in contact with the pad PD. That is, to the portion of the pad PD which is exposed in the opening OP, copper wires are bonded.

As shown in FIGS. 4 to 8, the region of the upper surface of the pad PD which is exposed in the opening OP and to which the copper wires are to be bonded is referred to as the wire bonding region WA.

In the insulating films 3D and 4B, the plugs 6H (see FIG. 2) extending through the insulating films 3D and 4E are formed. The plugs 6H are coupling electrodes made of a conductor film embedded in through holes 7D formed in the insulating films 3D and 4B, i.e., vias. The plugs 6H electrically couple the wires 5C to the pad PD. That is, the pad PD is electrically coupled to the lower-layer wires 5C through the plugs 6H. The configuration of each of the plugs 6H except for the dimensions thereof is the same as that of each of the plugs 6L.

Note that, in the cross-sectional view of FIG. 2, for the sake of convenience of illustration, the plugs 6H are shown at positions where the plugs 6H are not present in the plan view of FIG. 5 the same applies also to FIG. 21 described later).

As shown in FIG. 5, the wiring layer M3 includes a power-supply-voltage encircling wire 5CP as the wire 5C and a reference-potential encircling wire 5CG as the wire 5C. The potential of the power-supply-voltage encircling wire 5CP is, e.g., a power supply voltage. The power-supply-voltage encircling wire 5CP supplies the power supply voltage to the wiring layers located under the wiring layer M3. The potential of the reference-potential encircling wire 5CG is, e.g., a ground potential. The reference-potential encircling wire 5CG supplies a reference potential to the wiring layers located under the wiring layer M3. In the example shown in FIG. 5, the power-supply-voltage encircling wire 5CP is electrically coupled to the pad PD (see, e.g., FIG. 1) via the plugs 6H.

In the power-supply-voltage encircling wire 5CP, slits SLT are formed. In the case where the slits SIT are riot formed in the power-supply-voltage encircling wire 5CP and the width of the power-supply-voltage encircling wire 5CP is large, when, e.g., the power-supply-voltage encircling wire 5CP is formed by a damascene method such as, e.g., a dual damascene method, the thickness of the power-supply-voltage encircling wire 5CP tends to be smaller than an intended thickness. On the other hand, in the case where the slits are formed in the power-supply-voltage encircling wire 5CP, even when the width of the power-supply-voltage encircling wire 5CP is large, the width of the power-supply-voltage encircling wire 5CP is apparently reduced. Accordingly, it is possible to prevent or inhibit the thickness of the power-supply-voltage encircling wire 5CP from being smaller than the intended thickness during the formation of the power-supply-voltage encircling wire 5CP.

As shown in FIG. 6, the wiring layer M2 includes a power-supply-voltage wire 5BP as the wire 5B and reference-potential wires 5BG as the wires 5B. The power-supply-voltage wire 5BP is electrically coupled to the power-supply-voltage encircling wire 5CP (see FIG. 5) via the plugs 6C. The reference-potential wires 5BG are electrically coupled to the reference-potential encircling wire 5CG (see FIG. 5) via the plugs 6C.

As shown in FIG. 7, the wiring layer Ml includes power-supply-voltage wires 5AP each as the wire 5A and a reference-potential wire 5AG as the wire 5A. The power-supply-voltage wires 5AP are electrically coupled to the power-supply-voltage wire 5BP (see FIG. 6) via the plugs 6B. The reference-potential wire 5AG is electrically coupled to the reference-potential wires 5BG (see FIG. 6) via the plugs 6B.

As described above, a consideration will be given of the case where the MISFETs Q are n-channel field effect transistors. In such a case, as shown in FIG. 8, the drain regions DR included in the MISFETs Q and formed in the upper surface of the substrate 1 are electrically coupled to the power-supply-voltage wires 5AP (see FIG. 7) via the plugs 6L and 6A. The source regions SR included in the MISFETs Q and formed in the upper surface of the substrate 1 are electrically coupled to the reference-potential wire 5AG (see FIG. 7) via the plugs 6L and 6A.

On the other hand, the gate electrodes GE of the MISFETs Q are electrically coupled to the reference-potential wire 5AG (see FIG. 7). That is, each of the potentials in the gate electrodes GE and the source regions SR of the MISFETs Q is the ground potential. This allows each of the MISFETs Q to be used as an ESD protective circuit which protects the semiconductor device from electrostatic discharge (ESD) due to static electricity from outside the semiconductor device.

Note that, in FIG. 8, the illustration or plugs electrically coupling the gate electrodes GE of the MISFETs Q to the reference-potential wire 5AG (see FIG. 7) is omitted. In addition, any of the wires 5A, 5B, and 5C forms a decoupling capacitance for protecting a power supply from potential fluctuations.

In Embodiment 1, as shown in FIGS. 1 to 5, the plugs 6H electrically coupling the wiring layer M3 to the uppermost wiring layer MH are not formed immediately under the opening OP. That is, none of the plurality of plugs 6H overlaps the opening OP in plan view.

Also, in Embodiment 1, as shown in FIGS. 1 to 3, 5, and 6, in the wiring layer M3, the wires 5C are formed immediately under the opening OP, but the plugs 6C electrically coupling the wiring layers M2 and M3 to each other are not formed immediately under the opening OP. That is, any of the wires 5C overlaps the opening OP in plan view, but none of the plurality of plugs 6C overlaps the opening OP in plan view.

Also, in Embodiment 1, as shown in FIGS. 1 to 3, 6, and 7, in the wiring layer M2, the wires 5B are formed immediately under the opening OP, but the plugs 6B electrically coupling the wiring layers M1 and M2 to each other are not formed immediately under the opening OP. That is, any of the wires 5B overlaps the opening OP in plan view, but none of the plurality of plugs 6B overlaps the opening OP in plan view.

Also, in Embodiment 1, as shown in FIGS. 1 to 3, 7, and 8, the MISFETs Q as the semiconductor elements are formed immediately under the opening OP. In the wiring layer M1, the wires 5A are formed immediately under the opening OP, but the plugs 6A electrically coupling the MISFETs Q to the wiring layer M1 are not formed immediately under the opening OP. That is, any of the MISFETs Q overlaps the opening OP in plan view and any of the wires 5A overlaps the opening OP, but none of the plurality of plugs 6A overlaps the opening OP in plan view.

In short, in Embodiment 1, none of the plurality of plugs 6B, 6C, and 6H each of which couples different two of the plurality of wiring layers overlaps the opening OP in plan view.

As a result, even in the case where a stress is applied to the portion of the pad PD which overlaps the opening OP in plan view when copper wires are bonded to the portion of the pad PD which is exposed from the opening OP, it is possible to prevent or inhibit the plugs coupling the different two wiring layers to each other from being deformed. Therefore, it is possible to prevent or inhibit a defect from occurring in the coupling between the different two wiring layers.

Note that, in Embodiment 1, as shown in FIGS. 1 to 3, 7, and 8, in the insulating film 3A, the plugs 6L are not formed immediately under the opening OP. That is, none of the plurality of plugs 6L overlaps the opening OP in plan view.

<Manufacturing Process of Semiconductor Device>

Figure 9:
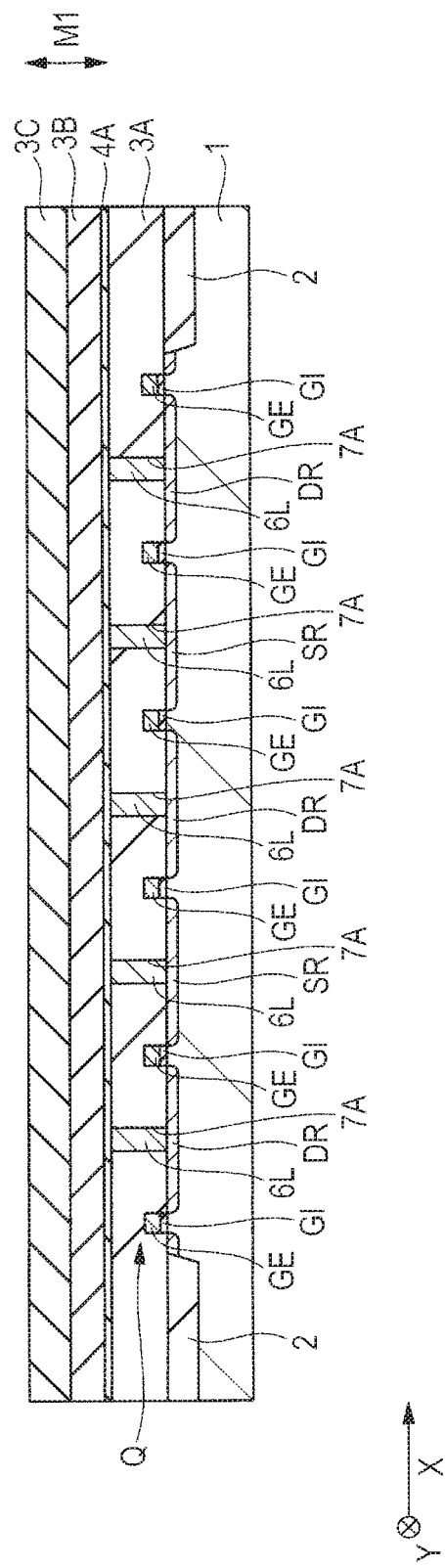
FIG. 9 is a main-portion cross-sectional view of the semiconductor device in Embodiment 1 during the manufacturing process thereof.
Figure 10:
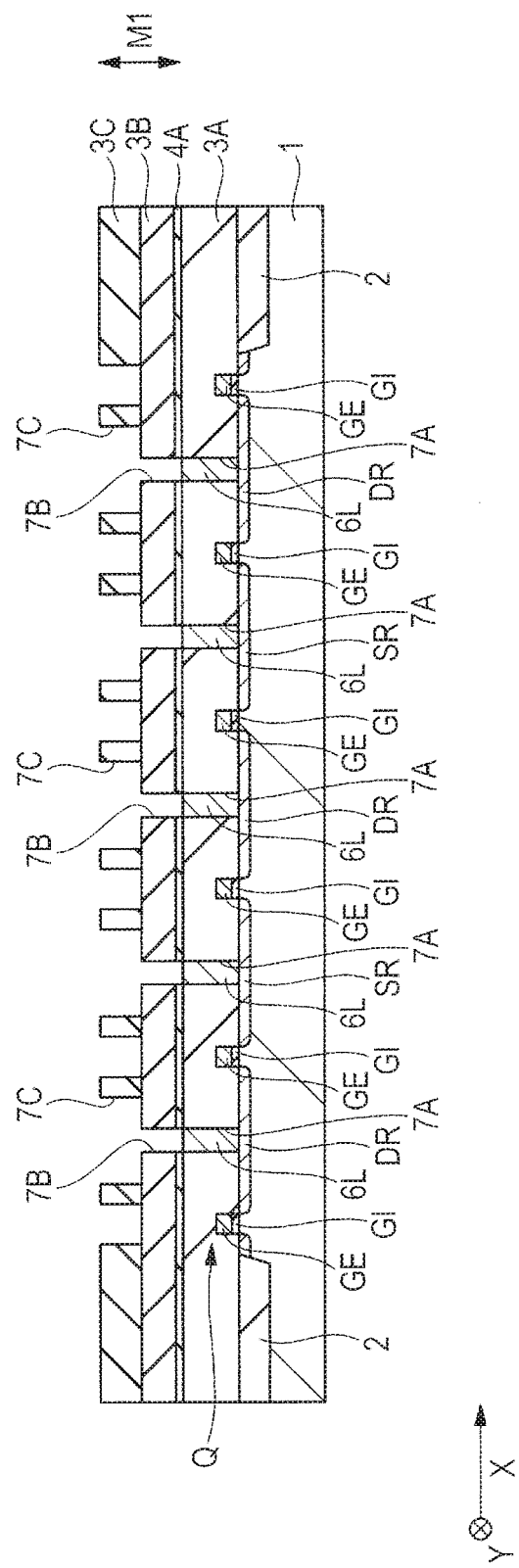
FIG. 10 is a main-portion cross-sectional view of the semiconductor device in Embodiment 1 during the manufacturing process thereof.
Figure 11:
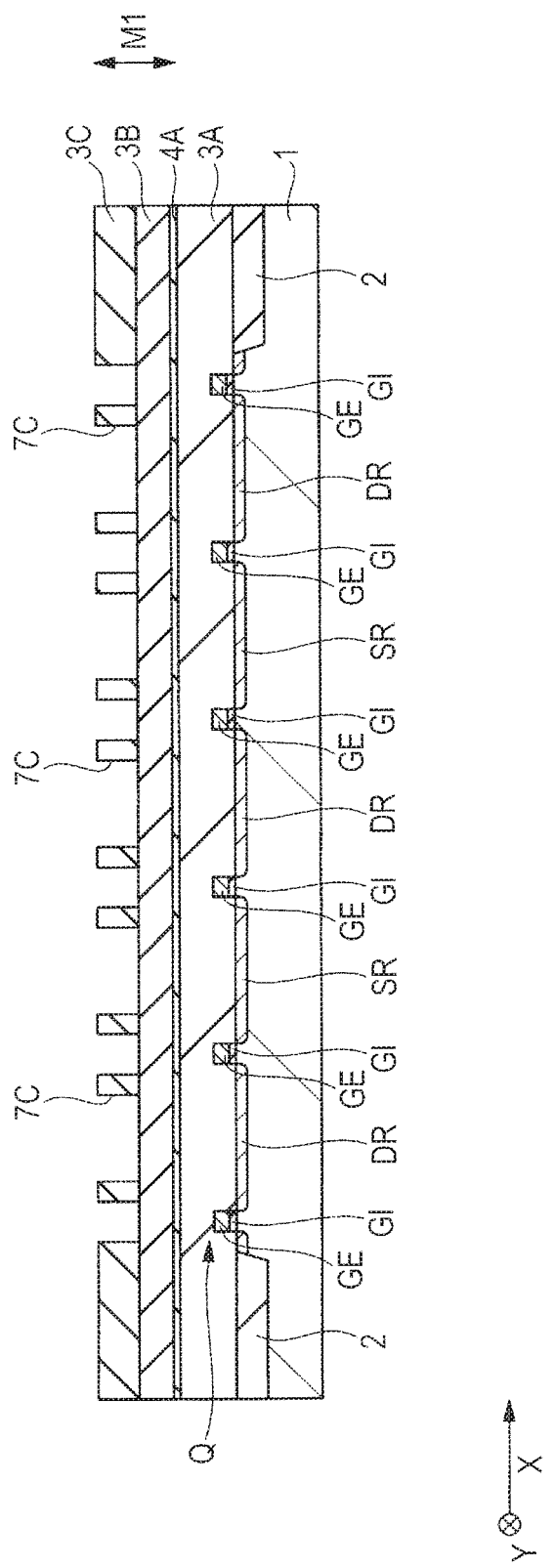
FIG. 11 is a main-portion cross-sectional view of the semiconductor device in Embodiment 1 during the manufacturing process thereof.
Figure 12:
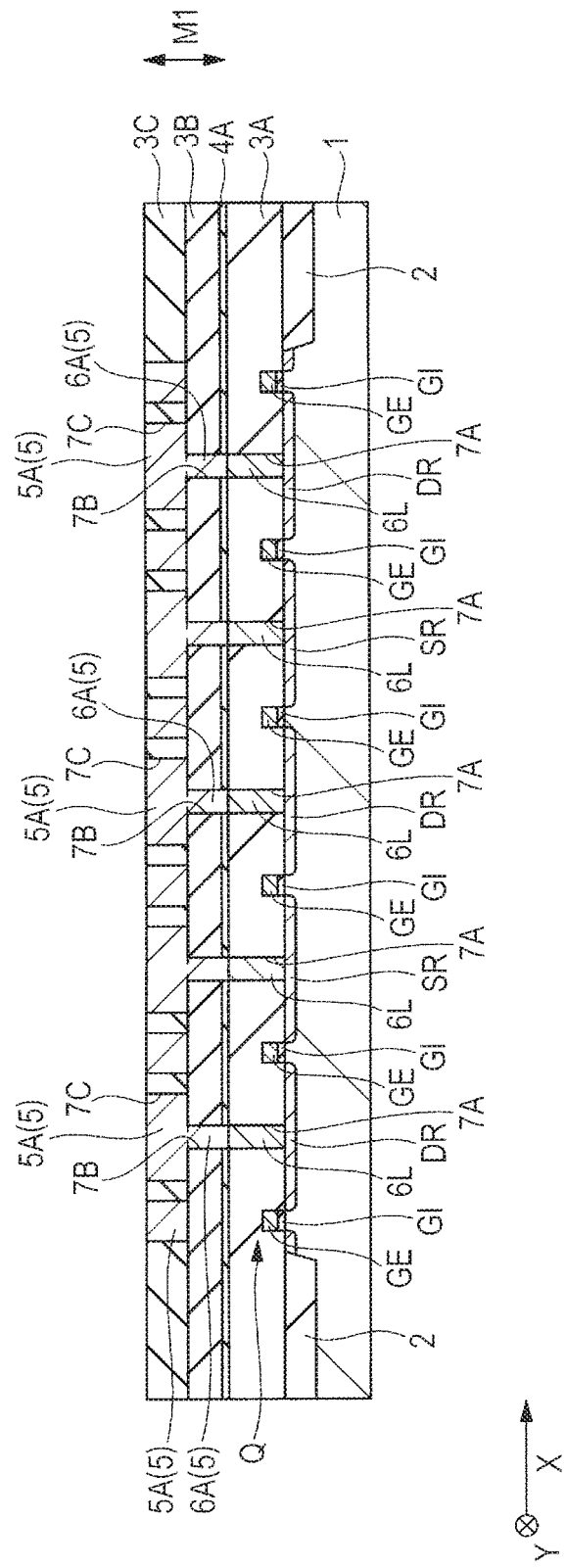
FIG. 12 is a main-portion cross-sectional view of the semiconductor device in Embodiment 1 during the manufacturing process thereof.
Figure 13:
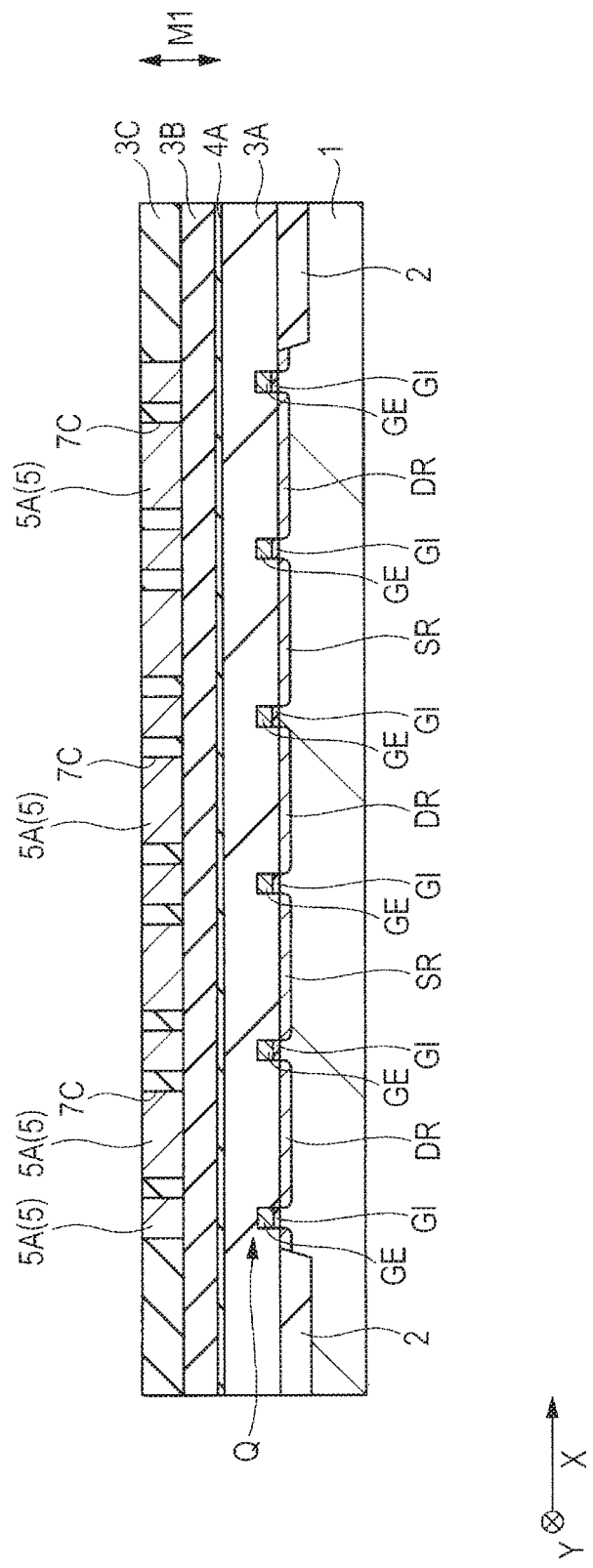
FIG. 13 is a main-portion cross-sectional view of the semiconductor device in Embodiment 1 during the manufacturing process thereof.

Next, the manufacturing process of the semiconductor device in Embodiment 1 will be described with reference to the drawings. FIGS. 9 to 13 are main-portion cross sectional views of the semiconductor device in Embodiment 1 during the manufacturing process thereof. FIGS. 9, 10, and 12 are cross-sectional views along the line A-A in each of FIGS. 4 to 8. FIGS. 11 and 13 are cross-sectional views along the line B-B in each of FIGS. 4 to 8.

First, as shown in FIG. 9, the substrate 1 is provided. The substrate 1 is made of a semiconductor wafer as the semiconductor substrate.

Next, in the upper surface as the main surface of the substrate 1, the trench-type isolation portion 2 is formed. Then, in the active region surrounded by the isolation portion 2, a plurality of semiconductor elements including, e.g., the MISFETs Q are formed. That is, as shown in FIG. 9, in the upper surface as the main surface of the substrate 1, the MISFETs Q are formed. Then, over the substrate 1, the insulating film 3A is formed so as to cover the MISFETs Q. Subsequently, the plurality of plugs 6L are formed as the plurality of coupling electrodes which extend through the insulating film 3A and couple the lowermost wiring layer M1 of the plurality of wiring layers to the MISFETs Q.

Next, over the upper surface of the substrate 1, the wiring layers M1, M2, and M3 are formed. Since the methods of forming the wiring layers M1, M2 and M3 are the same, the methods of forming the wiring layers M1, M2, and M3 will be described herein using the method of forming the wiring layer M1 as an example.

First, as shown in FIG. 9, over the insulating film 3A, the insulating films 4A, 3B, and 3C included in the wiring layer M1 are deposited upwardly in this order by, e.g., a chemical vapor phase growth (Chemical Vapor Deposition: CVD) method.

Next, as shown in FIG. 10, in the portion of the insulating film 3C included in the wiring layer M1 which is located in the region where the wires 5A (see FIG. 12) are to be formed, the wire trenches 7C are formed by a photolithographic process and a dry etching process. On the other hand, in the portions of the insulating films 3B and 4A exposed at the bottom portions of the wire trenches 7C which are located in the regions where the plugs 6A (see FIG. 12) are to be formed, the through holes 7B extending from the bottom portions of the wire trenches 7C and reaching the upper surfaces of the plugs 6L are formed by a photolithographic process and a dry etching process. The photolithographic process refers to a sequence of processes such as the application of a photoresist film, exposure to light, and development.

At this time, the etching selectivity between each of the insulating films 3B and 3C and the insulating film 4A is increased. This allows the insulating film 4A to function as an etching stopper when the insulating films 3B and 3C are etched and prevents the insulating films 3B and 3C from being etched when the insulating film 4A is etched.

Note that, as shown in FIG. 11, in the portions of the insulating films 3B and 4A included in the wiring layer M1 which are located immediately under the region where the opening OP (see FIG. 2) is to be formed, the through holes 7B are not formed. That is, the through holes 7B formed in the step of forming the wiring layer M1 do not overlap the opening OP (see FIG. 2) in plan view.

Next, as shown in FIG. 12, over the upper surface of the substrate 1, the conductive film 5 is deposited so as to be embedded in the wire trenches 7C and the through holes 7B. The conductive film 5 includes the barrier metal film and the main wiring member which are deposited upwardly in this order. The barrier metal film is deposited by a sputtering method or the like. The main wiring member is deposited by a sputtering method and a plating method or the like. That is, the main wiring member is formed by first depositing a thin seed layer made of, e.g., copper by a sputtering method or the like and then depositing a conductor film made of, e.g., copper by a plating method or the like.

Next, the portion of the conductor film 5 which is located outside the wire trenches 7C and the through holes 7B is removed by a chemical mechanical polishing method. Thus, as shown in FIG. 12, the wires 5A made of the conductor film 5 embedded in the wire trenches 7C and the plugs 6A made of the conductor film 5 embedded in the through holes 7B are formed. Consequently, the wiring layer M1 includes the wires 5A.

Note that, as shown in FIG. 13, in the portions of the insulating films 3B and 4A included in the wiring layer M1 which are located immediately under the region where the opening OP (see FIG. 2) is to be formed, the wiring layer M1 made of the conductor film 5 embedded in the wire trenches 7C is formed, but the plugs 6A (see FIG. 12) made of the conductor film 5 embedded in the through holes 7B are not formed. That is, the plugs 6A (see FIG. 12) formed in the step of forming the wiring layer M1 do not overlap the opening OP in plan view.

After the wiring layers M1, M2, and M3 are thus formed, the uppermost wiring layer MH is formed.

First, as shown in FIGS. 1 and 2, over the upper surface of the substrate 1, the insulating films 4B and 3D included in the uppermost layer wiring MH are deposited upwardly in this order by a CVD method or the like so as to cover the top surfaces of the insulating film 3C (see FIG. 3) and the wires 5C which are included in the wiring layer M3. Then, the through hoes 7D are formed in the insulating films 3D and 4B. Subsequently, in the through holes 7D, the plugs 6lH are formed using the same method as used to form the plugs 6L.

Next, over the upper surface of the substrate 1, e.g., a barrier metal film, a main wiring member, and a barrier metal film are deposited upwardly in this order so as to cover the top surfaces of the insulating film 3D and the plugs 6H which are included in the uppermost wiring layer MH, thereby forming a laminated conductor film. Then, the laminated conductor film is patterned by a photolithographic process and art etching process to form the pad PD as an electrode terminal made of the laminated conductor film. Note that, when the pad PD is formed, wires which are made of the laminated conductor film formed in the same layer as that of the laminated conductor film included in the pad PD and are included in the uppermost wiring layer MH may also be formed.

Next, over the upper surface of the substrate 1, a silicon dioxide film and a silicon nitride film are deposited upwardly in this order by a CVD method or the like so as to cover the top surface of the pad PD and a polyimide resin film is deposited thereover by a coating method or the like to thus form the insulating film 3E. That is, over the pad PD, the insulating film 3E is formed.

Next, as shown in FIG. 2, the opening OP is formed so as to expose a part of the pad PD from the insulating film 3E. That is, the opening OP is formed to extend through the insulating film 3E and reach the upper surface of the pad PD. At this time, the uppermost-layer barrier metal film of the portion of the pad PD which is exposed from the opening OP may also be removed.

Thus, the plurality of wiring layers M1, M2, M3, and MH stacked over the upper surface of the substrate 1 are formed and the plurality of plugs 6B, 6C, and 6H coupling different two of the plurality of wiring layers to each other are formed. At this time, in the steps of forming the plurality of wiring layers M1, M2, M3, and MH, after the wiring layers M1, M2, and M3 included in the plurality of wiring layers and located under the uppermost layer are formed, the uppermost wiring layer MH is formed.

Next, by performing a dicing process on the substrate 1, individual semiconductor chips are cut out of the substrate 1. Then, to the wire bonding region WA (see FIG. 4) as the region of the upper surface of the portion of the pad PD which is exposed in the opening OP and to which bonding wires are to be bonded, bonding wires are bonded by ultrasonic bonding which is performed by allowing a current to flow using, e.g., an ultrasonic bonding apparatus. Then, through a sealing step, the semiconductor device is manufactured.

<About Deformation of Plugs Immediately Under Opening>

Next, the deformation of the plugs immediately under the opening will be described in comparison to an example in which plugs are formed immediately under an opening, i.e., Comparative Example 1.

Figure 14:
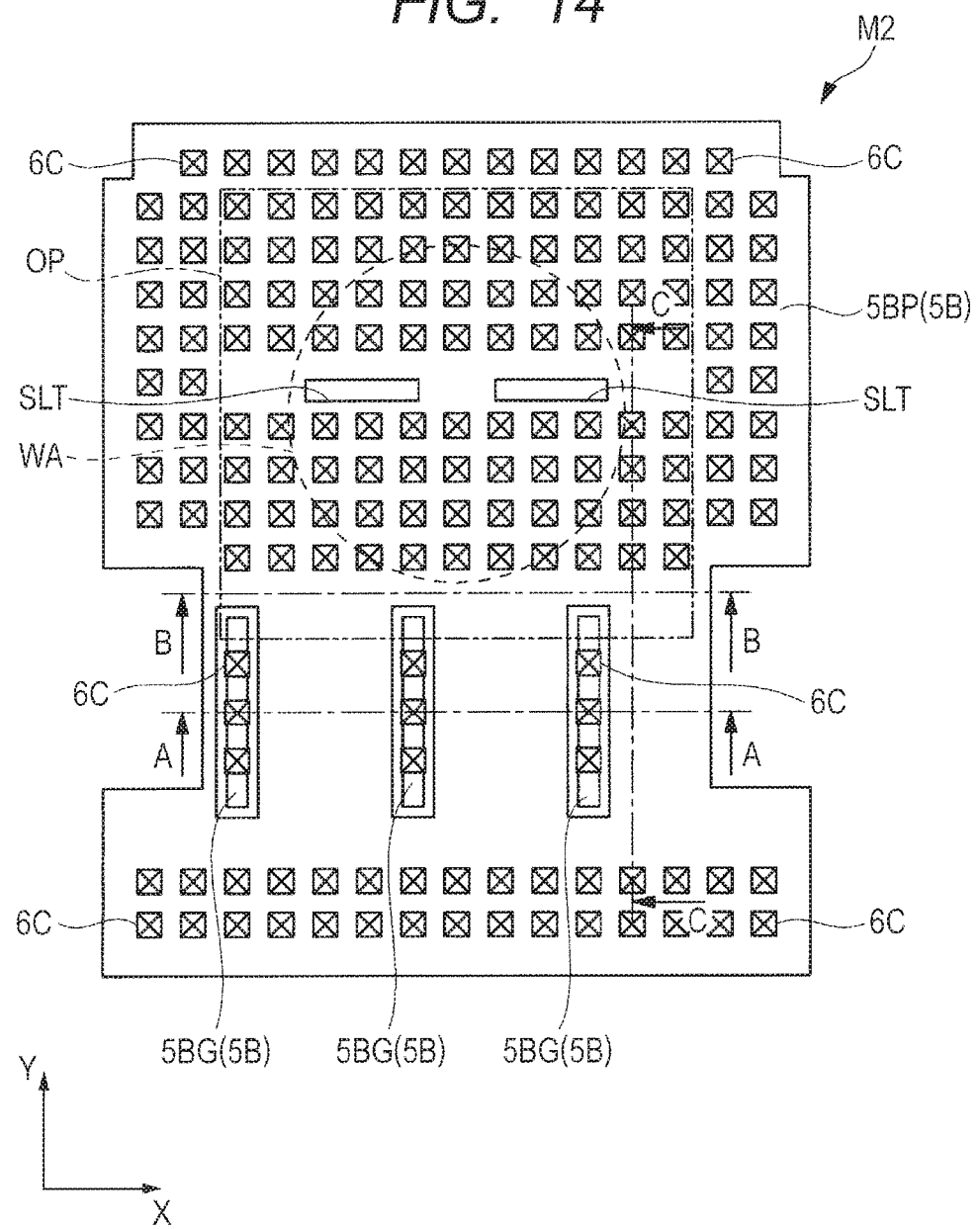
FIG. 14 is a main-portion plan view of a semiconductor chip in a semiconductor device in Comparative Example 1.
Figure 15:
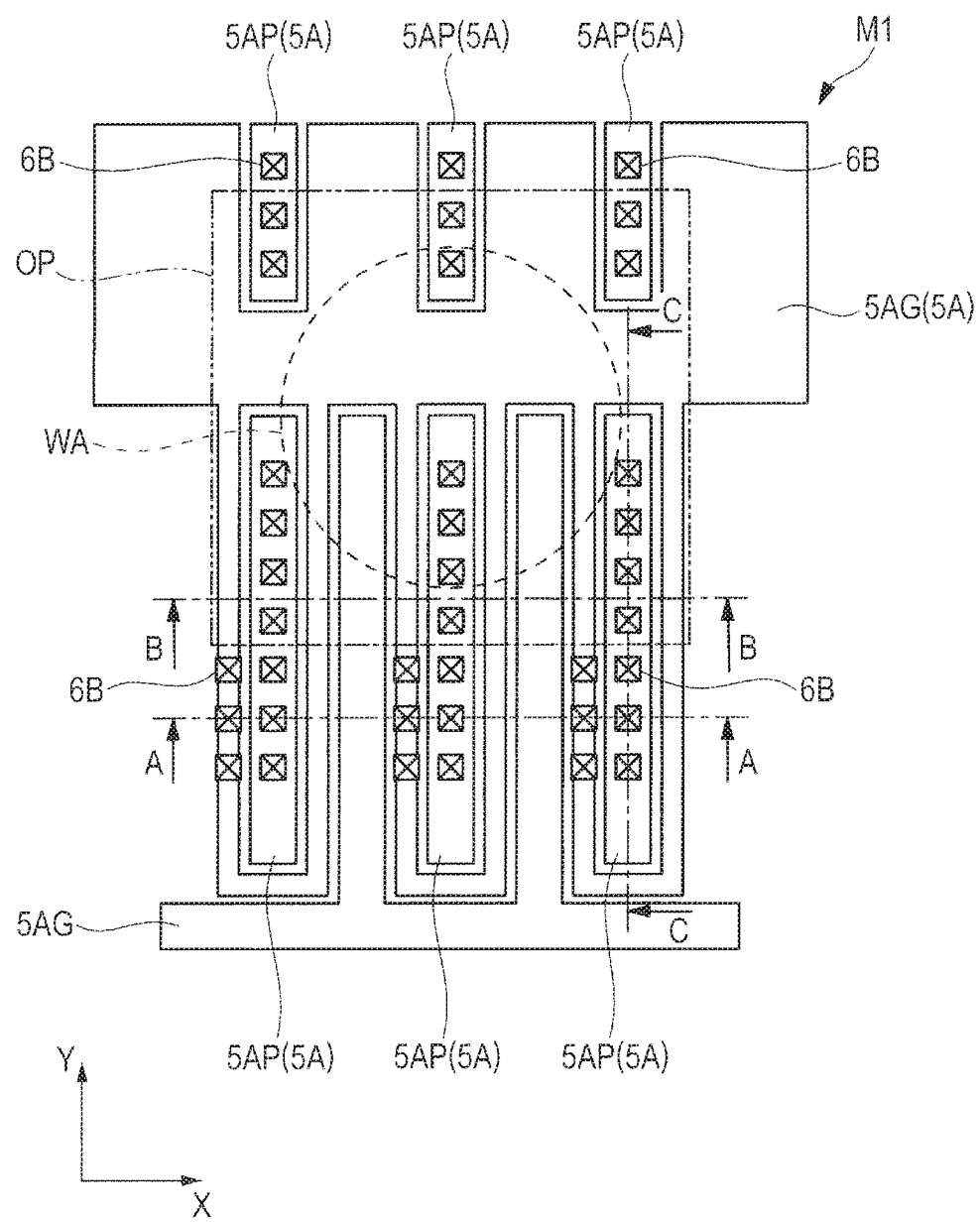
FIG. 15 is a main-portion plan view of the semiconductor chip in the semiconductor device in Comparative Example 1.
Figure 16:
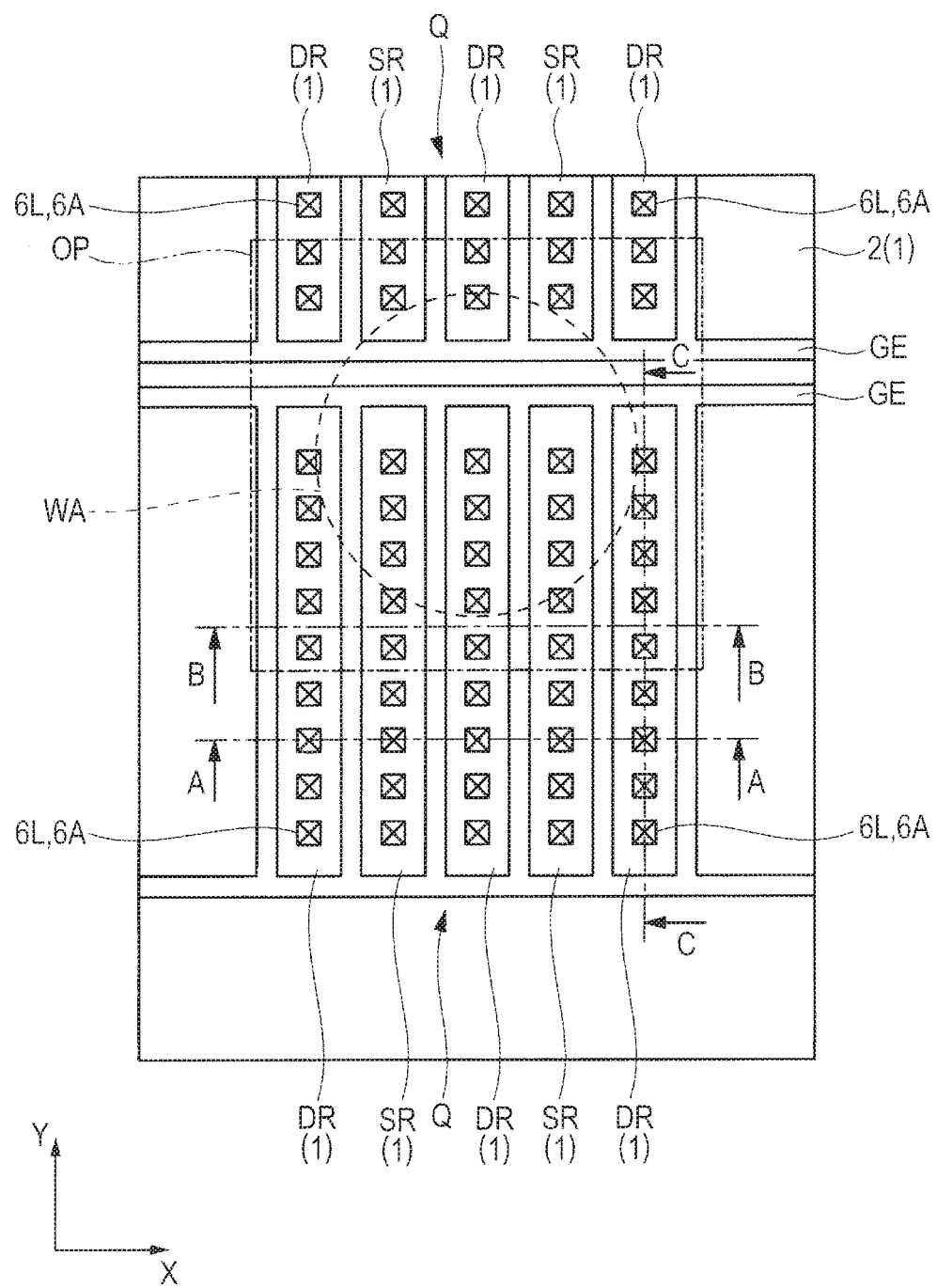
FIG. 16 is a main-portion plan view of the semiconductor chip in the semiconductor device in Comparative Example 1.

FIGS. 14 to 16 are main-portion plan view of a semiconductor chip of a semiconductor device in Comparative Example 1. FIG. 14 shows an example of the layout of the wires 5B included in the wiring layer M2 in the vicinity of the opening OP. FIG. 15 shows an example of the layout of the wires 5A included in the wiring layer M1 in the vicinity of the opening OP. FIG. 16 shows an example of the layout of the MISFETs Q in the vicinity of the opening OP. In FIGS. 14 to 16, the position of the opening OP is shown by the two-dot-dash line and the position of the wire bonding region. WA is shown by the broken line.

The uppermost wiring layer MH and the wiring layer M3 in Comparative Example 1 are the same as the uppermost wiring layer MH and the wiring layer M3 in Embodiment 1 described using FIGS. 4 and 5.

On the other hand, in Comparative Example 1, as shown in FIG. 14, immediately under the opening OP, the plugs 6C electrically coupling the wiring layers M2 and M3 to each other are formed. That is, any of the plugs 6C overlaps the opening OP in plan view.

Also, in Comparative Example 1, as shown in FIGS. 14 and 15, the wires 5B are formed immediately under the opening OP in the wiring layer M2 and the plugs 6B electrically coupling the wiring layers M1 and M2 to each other are formed immediately under the opening OP. That is, any of the wires 5B overlaps the opening OP in plan view and any of the plugs 6B overlaps the opening OP in plan view.

In Comparative Example 1, as shown in FIGS. 15 and 16, in the upper surface of the substrate 1, the MISFETs Q are formed as the semiconductor elements immediately under the opening OP. In the wiring layer M1, the wires 5A are formed immediately under the opening OP and the plugs 6A electrically coupling the MISFETs Q to the wiring layer M1 are formed immediately under the opening OP. That is, any of the MISFETs Q overlaps the opening OP in plan view, any of the wires 5A overlaps the opening OP in plan view, and any of the plugs 6A overlaps the opening OP in plan view.

In such a case, when copper wires are bonded to the portion of the pad PD which is exposed from the opening OP, a large stress is applied to the plugs formed immediately under the opening OP. As a result, the plugs are more likely to be deformed and a defect is more likely to occur in the coupling between different two wiring layers. This may be conceivably because, when any of the plugs overlaps the opening OP in plan view, the large stress is applied to the plug upon the bonding of copper wires to the portion of the pad PD which is exposed from the opening OP to deform the plug and the deformed plug peels off the wire located under or over the plug. Since the contact area between the plug and the wire located under or over the wire is small, even when the amount of deformation of the plug is small, a defect is likely to occur in the coupling between different two wiring layers.

In particular, when the total number of the wiring layers including the uppermost wiring layer is reduced to 4 or less, manufacturing cost can be reduced, but the stress applied to the portion of each of the wiring layers which overlaps the opening OP in plan view increases. Accordingly, when copper wires are bonded to the portion of the pad PD which is exposed from the opening OP, a defect is more likely to occur in the coupling between different two wiring layers.

In the technique disclosed in Patent Document 1 described above, in the wiring layer immediately under the uppermost one of the plurality of wiring layers, the conductive pattern is not formed immediately under the external terminal included in the uppermost wiring layer. Accordingly, the plugs are also not formed immediately under the external terminal. However, in the technique disclosed in Patent Document 1 described, above, none of the plurality of wires included in each of the wiring layers is placed immediately under the pad. Therefore, the area of the semiconductor chip cannot be reduced.

<About Types of Wires Bonded to Pad and Non-Defective Plug Ratio>

Next, a description will be given of the types of the wires bonded to the pad PD and a non-defective plug ratio in comparison to those in an example in which the plugs are formed immediately under the opening, OP, i.e., Comparative Examples 1 and 2. It is assumed herein that, in Comparative Example 1, copper (Cu) wires are bonded to the pad. PD by ultrasonic bonding and, in Comparative Example 2, gold (Au) wires are bonded to the pad PD by ultrasonic bonding. Note that the semiconductor device in Comparative Example 2 is the same as the semiconductor device in Comparative Example 1 except that gold wires are bonded instead of copper wires.

Figure 17:
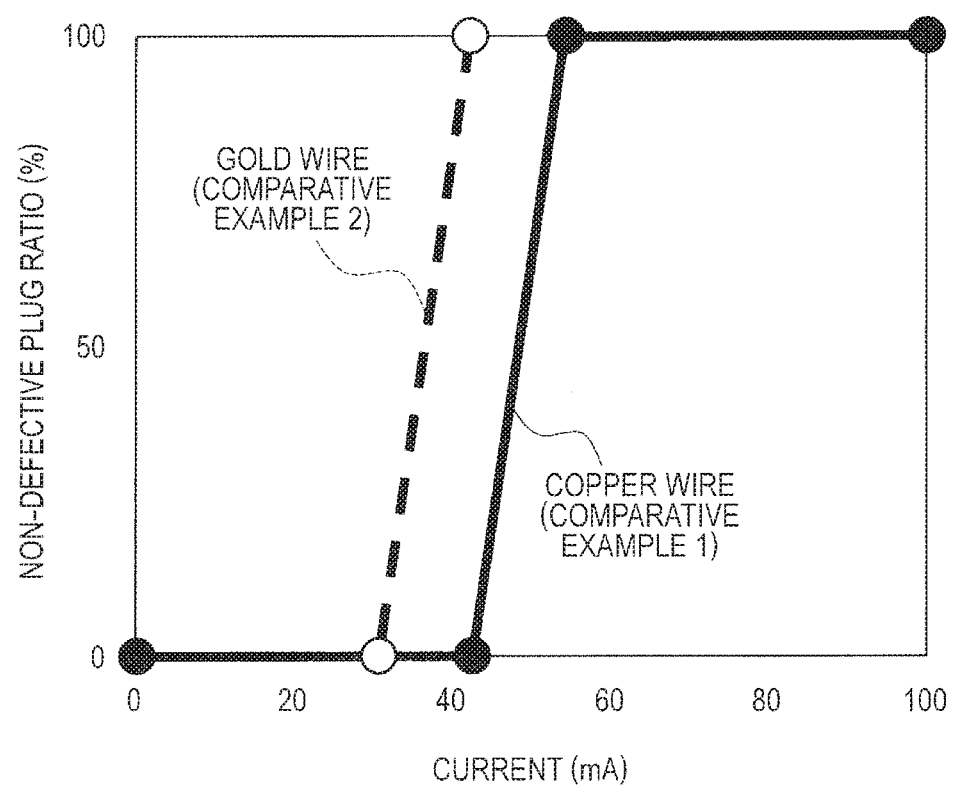
FIG. 17 is a graph showing the relationship between a current allowed to flow in an ultrasonic bonding apparatus and a non-defective plug ratio in each of Comparative Examples 1 and 2.

FIG. 17 is a graph showing the relationship between a current allowed to flow in an ultrasonic bonding apparatus and the non-defective plug ratio in each of Comparative Examples 1 and 2. In FIG. 17, the abscissa axis represents a current USG allowed to flow by the ultrasonic bonding apparatus and the ordinate axis represents the non-defective plug ratio.

As shown in FIG. 17, in either of the cases where the gold wires are bonded (Comparative Example 2) and where the copper wires are bonded (Comparative Example 1), the non-defective plug ratio increases as the current USG increases. This means that the wires are ultrasonic-bonded to the pad PD by allowing a sufficiently large amount of the current USG to flow.

However, the non-defective plug ratio in Comparative Example 1 when the current USG ranging from 30 to 50 mA flows is lower than the non-defective plug ratio in Comparative Example 2 when the same current USG flows. This may be conceivably because, e.g., the copper wires are harder than the gold wires and because the stress applied to the plugs when the copper wires are bonded in Comparative Example 1 is larger than the stress applied to the plugs when the gold wires are bonded in Comparative Example 2, the plugs are more likely to be deformed, and the deformed plugs peel off the wires located under or over the wires.

When the non-defective plug ratio was actually lower than 100%, a crack formed in the pad. PE) was observed at the top surface of the semiconductor chip. Accordingly, it can be considered that the deformed plug peeled off the wire located below or over the plug. It can also be considered that, in the wire formed immediately under the pad PD also, a crack was formed.

Thus, the present inventors have found that the problem that a defect is likely to occur in the coupling between different two layers when the copper wires are bonded to the pad PD is more conspicuous when the copper wires are bonded to the pad PD than when the gold wires are bonded to the pad PD.

On the other hand, in the technique disclosed in Patent Document 1 described above, the problem that a defect is more likely to occur in the coupling between different two wiring layers when the copper wires are bonded than when the gold wires are bonded has not been found.

<Main. Characteristic Features and Effects of Embodiment 1>

On the other hand, in the semiconductor device in Embodiment 1, any of the MISFETs Q overlaps the opening OP in plan view, any of the wires 5A overlaps the opening OP in plan view, and any of the wires 5B overlaps the opening OP in plan view, while none of the plurality of plugs 6B overlaps the opening OP in plan view. In addition, any of the wires 5C overlaps the opening OP in plan view, while none of the plurality of plugs 6C overlaps the opening OP in plan view and none of the plurality of plugs 6H overlaps the opening OP in plan view.

That is, in Embodiment 1, none of the plurality of plugs 6B, 6C, and 6H each coupling different two of the plurality of wiring layers overlaps the opening OP in plan view.

As a result, even when a stress is applied to the portion of the pad PD which overlaps the opening OP in plan view upon the bonding of copper wires to the portion of the pad PD which is exposed from the opening OP, it is possible to prevent or inhibit the plug coupling different two wiring layers to each other from being deformed. Accordingly, it is possible to prevent or inhibit a defect from occurring in the coupling between the different two wiring layers. This allows an improvement in the performance of the semiconductor device.

Specifically, since the contact area between the plug and the wire located under or over the plug is small, even when the amount of deformation of the plug is small, a defect is likely to occur in the coupling between different two wiring layers. However, in Embodiment 1, no plug is placed immediately under the opening OP. Therefore, it is possible to prevent or inhibit a defect from occurring in the coupling between different two wiring layers due to the deformation of the plug.

Also, in Embodiment 1, in each of the wiring layers located under the uppermost one of the plurality of wiring layers, any of the plurality of wires included in the wiring layer is placed immediately under the pad. Accordingly, the area of the semiconductor chip can be reduced more significantly than in the case of using the technique disclosed in Patent Document 1 described above in which none of the plurality of wires included in each of the wiring layers is placed immediately under the pad.

Also, in Embodiment 1, even when a crack is formed in the wire formed immediately under the pad PD, there is no plug immediately under the pad. Therefore, it is possible to prevent or inhibit a defect from occurring in the coupling between different two wiring layers due to the deformation of the plug.

Preferably, the total number of the wiring layers including the uppermost wiring layer is 4 or less. By reducing the total number of the wiring layers including the uppermost wiring layer, manufacturing cost can be reduced, but a stress is more likely to be applied to the portion of each of the wiring layers which overlaps the opening in plan view. As a result, when any of the plugs overlaps the opening OP in plan view, a large stress is applied to the plug when copper wires are bonded to the portion of the pad PD which is exposed from the opening OP and the plug is more likely to be deformed. Accordingly, when the total number of the wiring layers including the uppermost wiring layer is 4 or less, the effect of preventing or inhibiting the deformation of the plug according to Embodiment 1 is further increased.

Also, as described above, to the portion of the pad PD which is exposed from the opening OP, copper wires are bonded.

The problem that, when bonding wires are bonded to the pad PD, a large stress is applied to the plug formed immediately under the opening OP to increase the likelihood of deformation of the plug is more conspicuous when copper wires are bonded to the pad PD than when gold wires are bonded to the pad PD. Accordingly, when copper wires are bonded to the portion of the pad PD which is exposed in the opening OP, by preventing any of the plugs from overlapping the opening OP in plan view in the same manner as in Embodiment 1, the effect of preventing or inhibiting the plug from being deformed is further increased.

Figure 18:
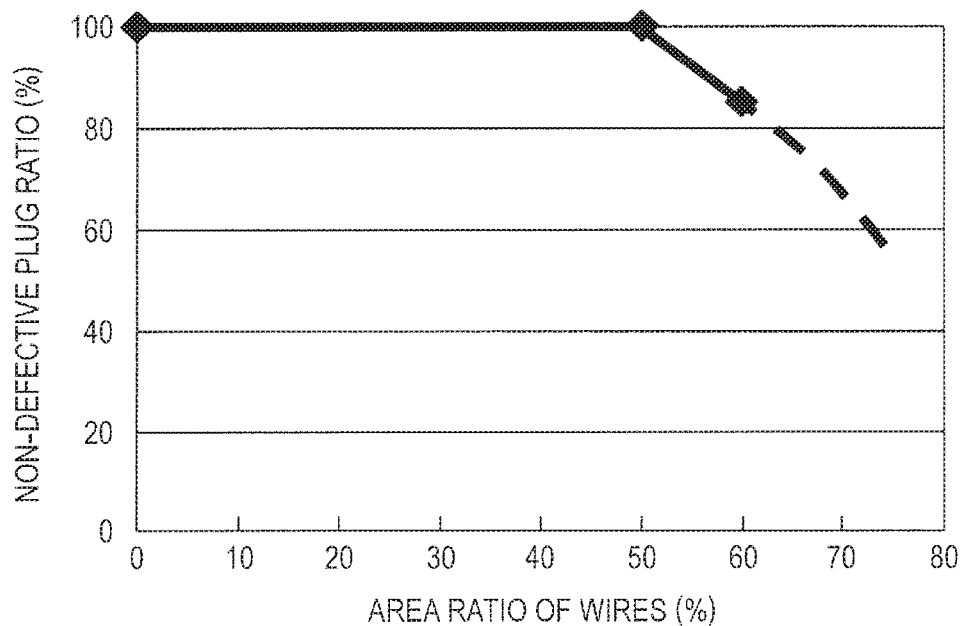
FIG. 18 is a graph showing the relationship between the area ratio of the wires formed immediately under the opening and the non-defective plug ratio.

FIG. 18 is a graph showing the relationship between the area ratio of the wires formed immediately under the opening and the non-defective plug ratio. Note that the area ratio of the wires shown in FIG. 18 is the ratio of the total area of the portions of the opening OP which individually overlap the plurality of wires in a given wiring layer to the area of the opening OP.

As shown in FIG. 18, when the area ratio of the wires formed immediately under the opening OP is 1 to 50%, the non-defective plug ratio is 100% so that none of the plugs has suffered a defect. On the other hand, when the area ratio of the wires formed immediately under the opening OP is, e.g., 60% and higher than 50%, the non-defective plug ratio is less than 100% so that any of the plugs has suffered a defect. In such a case, it can be considered that, since the area ratio of the wires is high, the total stress applied to the wires has increased and caused the defect in the plug.

To prevent a defect from occurring in any of the plugs, the area ratio of the wires formed immediately under the opening OP is preferably 1 to 50%. In this case, it can be considered that, since the area ratio of the wires is low, the total stress applied to the wires has decreased and caused no defect in any of the plugs. Note that, when the area ratio of the wires is 0%, i.e., no wire is formed immediately under the opening OP in a given wiring layer also, none of the plugs has suffered a defect.

Figure 19:
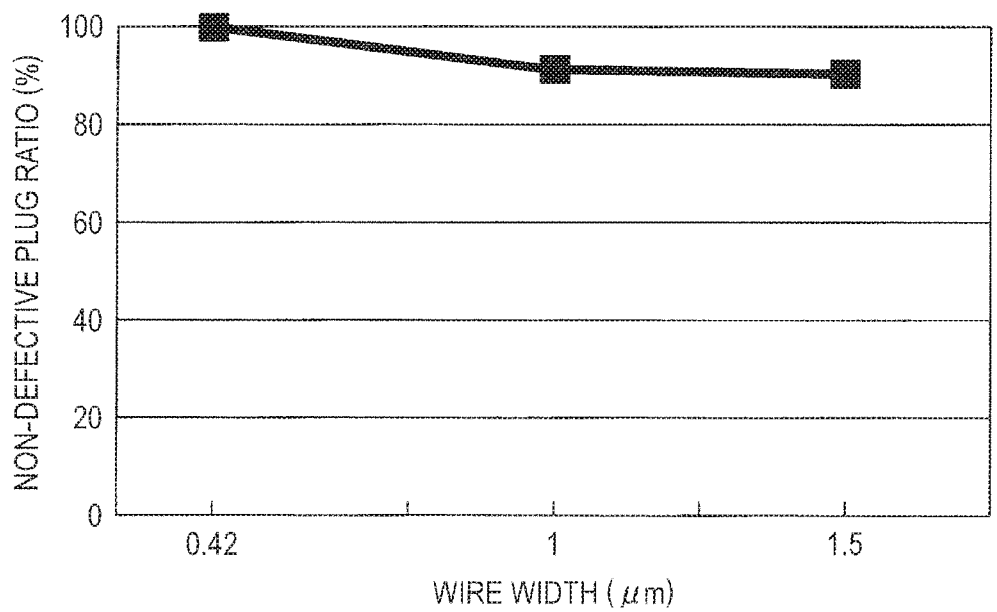
FIG. 19 is a graph showing the relationship between the width of each of the wires formed immediately under the opening and the non-defective plug ratio.

FIG. 19 is a graph showing the relationship between the width of each of the wires formed immediately under the opening and the non-defective plug ratio.

As shown in FIG. 19, when the width of each of the wires formed immediately under the opening OP is, e.g., 1 µm, 1.5 µm, or the like and not less than 1 µm, the non-defective plug ratio is less than 100% so that any of the plugs has suffered a defect. In such a case, it can be considered that, since the width of the wire is large, the total stress applied to the wires has increased and caused the defect in the plug.

On the other hand, when the width of each of the wires formed immediately under the opening OP is, e.g., 0.42 µm or the like and less than 1 µm, the non-defective plug ratio is 100% so that none of the plugs has suffered a defect. In such a case, it can be considered that, since the width of the wire is small, the total stress applied to the wires has decreased and caused no defect in any of the plugs. To prevent a defect from occurring in any of the plugs, the area ratio of the wires formed immediately under the opening OP is less than 1 µm or preferably not more than 0.42 µm.

Each of the non-defective plug ratios shown in FIGS. 18 and 19 described above is a non-defective plug ratio when the thickness of the pad PD made of aluminum (Al) is 1 µm. When the thickness of the pad. PD is not more than 3 µm, the same result as obtained with each of the non-defective plug ratios shown in FIGS. 18 and 19 is obtained. Thus, when the thickness of the pad PD made of aluminum is not more than 3 µm, the effect according to Embodiment. 1, i.e., the effect of preventing or inhibiting any of the plugs from suffering a defect is increased by forming no plug immediately under the opening.

That is, preferably, any of the wiring layers M1, M2, and M3 each located under the uppermost wiring layer PH includes a plurality of wires each extending in the Y-axis direction in plan view and each of the plurality of wires overlaps the opening OP in plan view. The ratio of the total area of the portions of the opening OP which individually overlap the plurality of wires extending in the Y-axis direction to the area of the opening OP in plan view is 1 to 50%. The width of each of the plurality of wires in the X-axis direction is less than 1 µm. The thickness of the pad PD is not more than 3 µm. In such a case, the effect of preventing or inhibiting any of the plugs from suffering a defect is increased by forming no plug immediately under the opening.

Note that, when the ratio of the total area of the portions of the opening OP which individually overlap the plurality of wires extending in the Y-axis direction to the area of the opening OP in plan view is 1 to 50%, the width of each of the plurality of wires in the X-axis direction is less than 1 µm, and the thickness of the pad PD is not more than 3 µm, plugs may also be formed immediately under the opening OP. Even in the case where the plugs are formed immediately under the opening OP, when the area ratio of the wires, the wire width, and the thickness of the pad PD are in the range shown above, the wires coupled to the plugs are more likely to be deformed integrally with the plugs upon the bonding of copper wires to the portion of the pad PD which is exposed from the opening OP. This prevents or inhibits the plugs from peeling off the wires located under or over the plugs. Accordingly, the effect of preventing or inhibiting a defect from occurring in any of the plugs is achieved, though the effect is smaller than when no plug is formed immediately under the opening OP.

(Embodiment 2)

In Embodiment 1, the description has been given of the example in which the MISFETs Q are coupled to the wires 5A via the plurality of plugs 6L each having a cylindrical or prismatic shape. On the other hand, in Embodiment 2, a description will be given of an example in which the MISFETs Q are coupled to the wires PA via plugs 6LE as slit vias extending in the gate width direction of each of the MISFETs Q.

<Structure of Semiconductor Device>

First, a structure of a semiconductor device in Embodiment 2 will be described with reference to the drawings.

Figure 20:
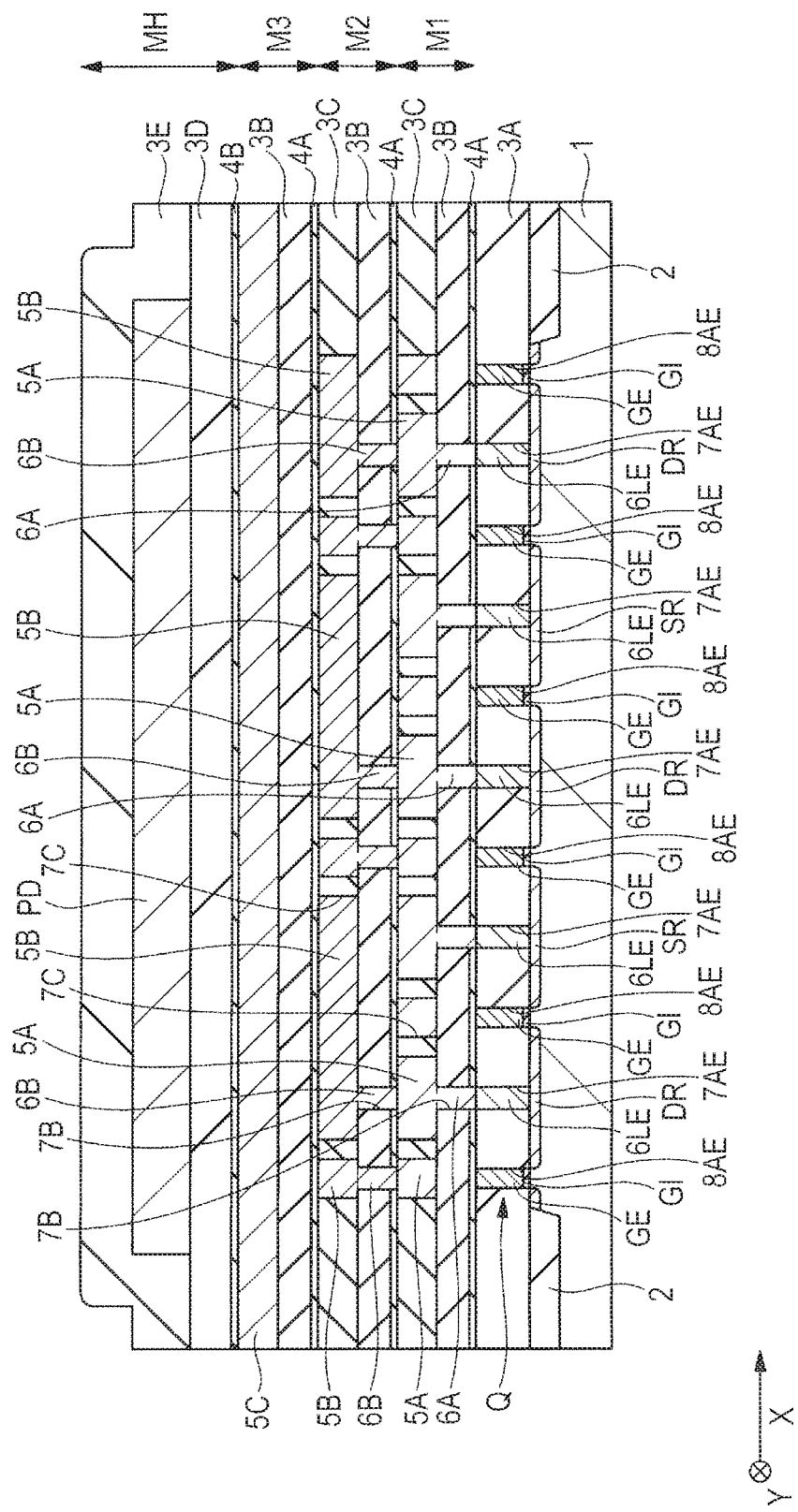
FIG. 20 is a main-portion cross-sectional view of a semiconductor chip of a semiconductor device in Embodiment 2.
Figure 21:
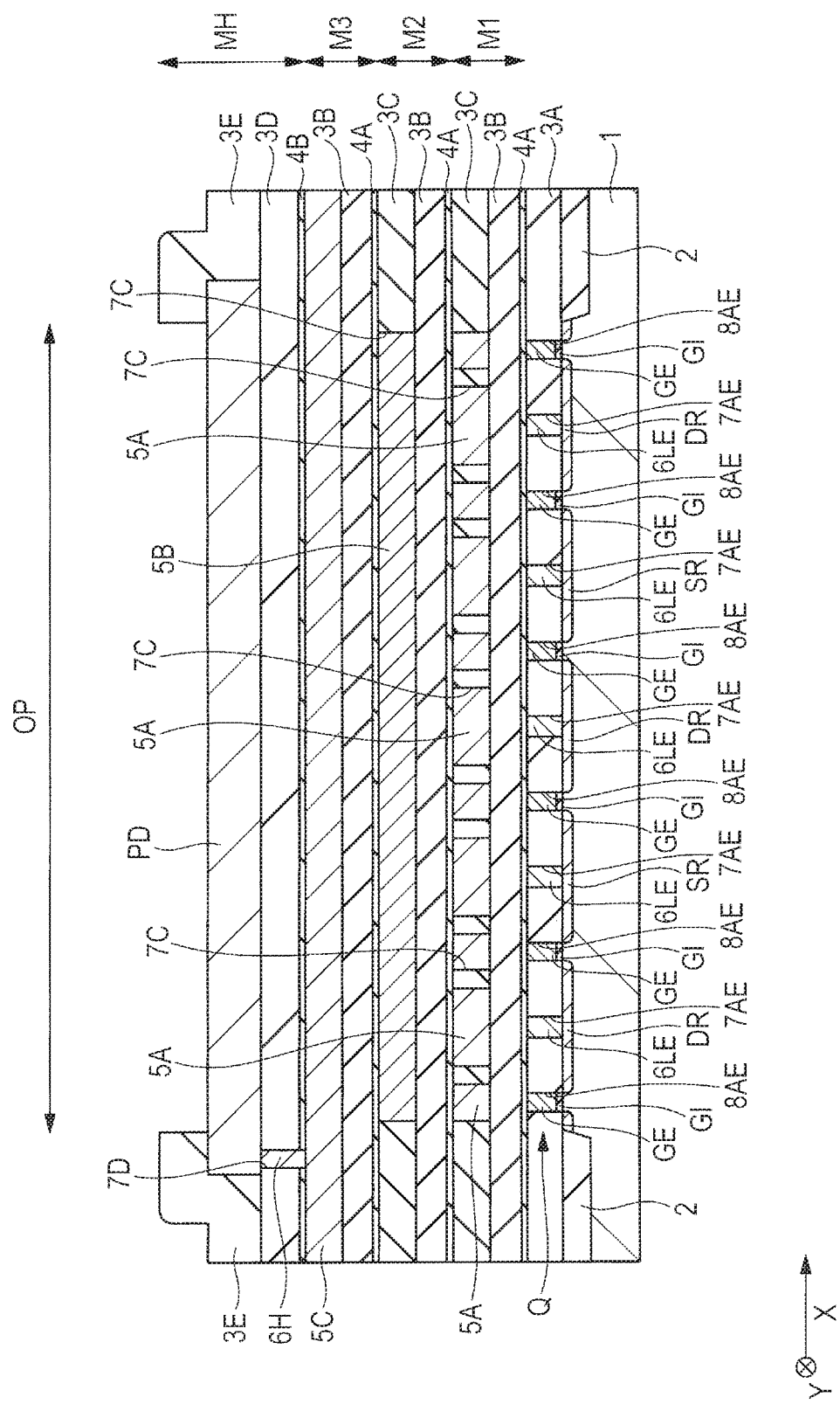
FIG. 21 is a main-portion cross-sectional view of the semiconductor chip in the semiconductor device in Embodiment 2.
Figure 22:
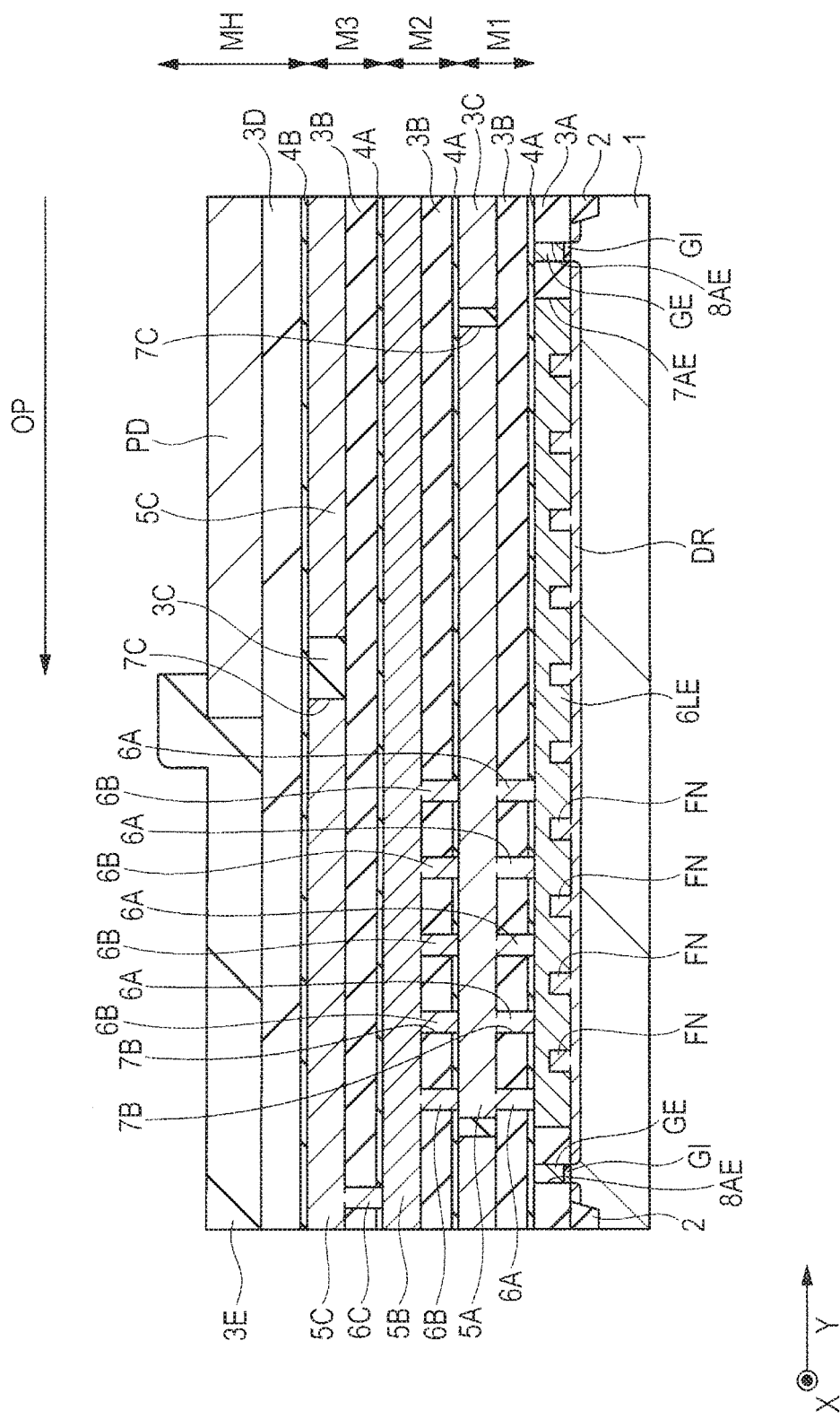
FIG. 22 is a main-portion cross-sectional view of the semiconductor chip in the semiconductor device in Embodiment 2.
Figure 23:
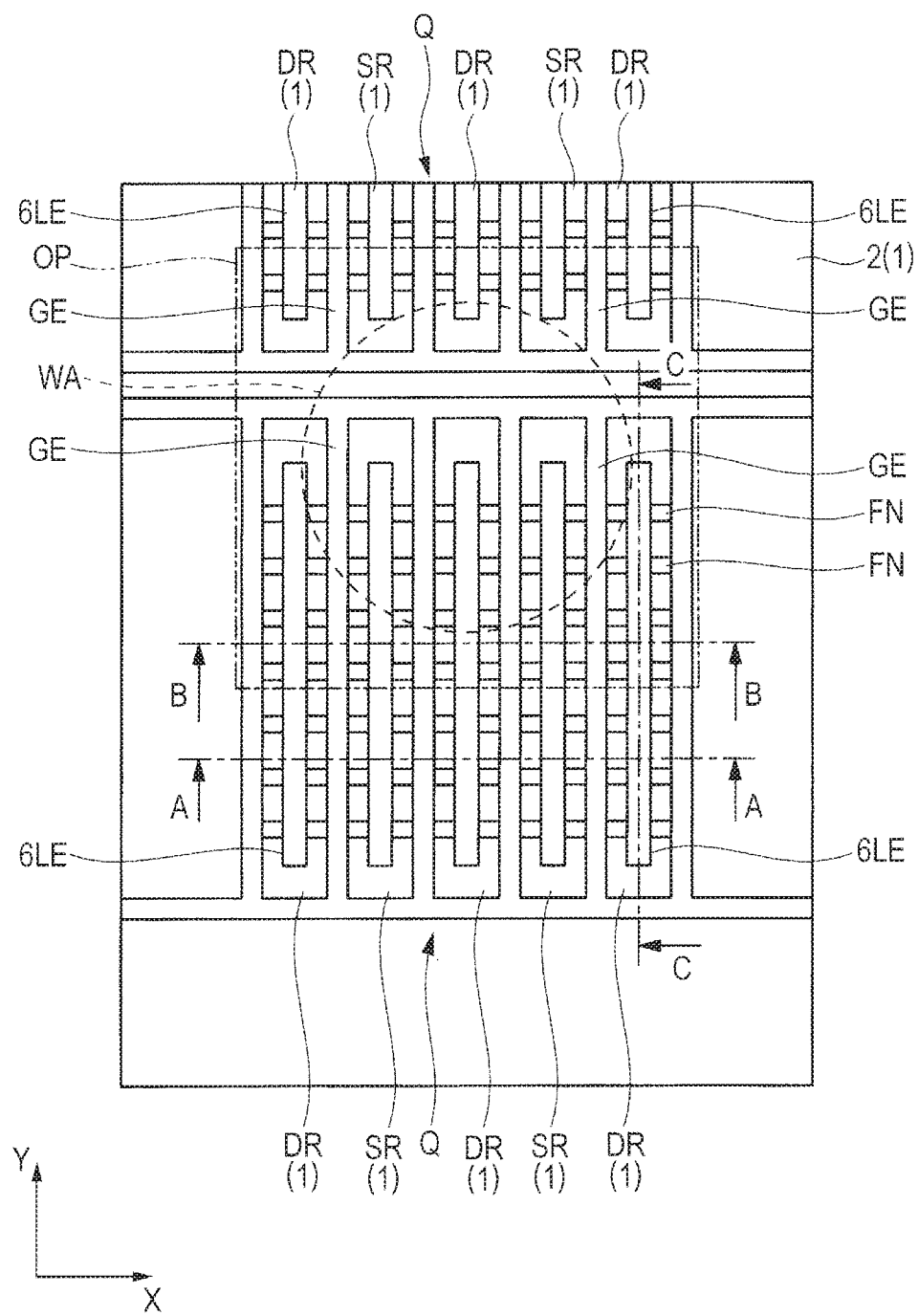
FIG. 23 is a main-portion plan view of the semiconductor chip in the semiconductor device in Embodiment 2.

FIGS. 20 to 22 are main-portion cross-sectional views of a semiconductor chip in the semiconductor device in Embodiment 2. FIG. 23 is a main-portion plan view of the semiconductor chip in the semiconductor device in Embodiment 2. FIG. 20 is a cross-sectional view along the line A-A in FIG. 23. FIG. 21 is a cross-sectional view along the line B-B in FIG. 23. FIG. 22 is a cross-sectional view along the line C-C in FIG. 23.

FIG. 23 snows an example of the layout of the MISFETs Q in the vicinity of the opening OP. In FIG. 23, the position of the opening OP is shown by the two-dot-dash line and the position of the wire bonding region WA is shown by the broken line. Note that, in FIG. 23, unlike in FIG. 8, the illustration of the plugs 6A is omitted.

The layout of the uppermost wiring layer ME in Embodiment is the same as that of the uppermost wiring layer MH in Embodiment 1 described using FIG. 4. The layout of the wires 5C included in the wiring layer M3 in Embodiment 2 is the same as the layout of the wires 5C included in the wiring layer M3 in Embodiment 1 described using 5. The layout of the wires 5B included in the wiring layer M2 in Embodiment 2 is the same as the layout of the wires 5B included in the wiring layer M2 in Embodiment 1 described using FIG. 6. The layout of the wires 5A included in the wiring layer M1 in Embodiment 2 is the same as the layout of the wires 5A included in the wiring layer M1 in Embodiment 1 described using FIG. 7.

The structure of the semiconductor device in Embodiment 2 is the same as the structure of the semiconductor device in Embodiment 1 except that the MISFETs Q are coupled to the wires 5A via the plugs 6LE extending in the gate width direction of each of the MISFETs Q and the structure of the MISFET Q is different. Accordingly, a description will be given mainly of the portions different from those in the structure of the semiconductor device in Embodiment 1.

In Embodiment 2 also, in the same manner as in Embodiment 1, the MISFETs Q are formed in the upper surface as the main surface of the substrate 1. Also, each of the MISFETs Q includes a pair of source and drain semiconductor regions formed in the upper surface of the substrate 1, the gate insulating film GI formed over the region of the upper surface of the substrate 1 which is located between the pair of semiconductor regions, and the gate electrode GE formed over the gate insulating film GI.

In Embodiment 2, as shown in FIGS. 4 and 23, the plurality of MISFETs Q are arranged so as to overlap the portion of the pad PD which is exposed in the opening OP. Note that the plurality of MISFETs Q are also arranged in the portion of the upper surface of the substrate 1 other than the portion thereof overlapping the portion of the pad PD which is exposed in the opening OP, though the illustration thereof is omitted in FIGS. 20 to 23.

As shown in FIGS. 20 to 23, the gate length direction of the gate electrode GE included in each of the MISFETs Q arranged so as to overlap the portion of the pad PD which is exposed in the opening OP is assumed to be the N-axis direction and the gate width direction of the gate electrode GE included in the MISFET Q is assumed to be the Y-axis direction.

Note that, by way of example, the following will describe the case where each of the MISFETs Q includes the source region SR and the drain region DR as the semiconductor regions and is an n-channel field effect transistor.

On the other hand, the plugs 61E as coupling electrodes in Embodiment 2 are the slit vias extending in the Y-axis direction as the gate width direction of each of the gate electrodes GE in plan view, unlike the plugs 6L as the coupling electrodes in Embodiment 1. That is, in Embodiment 2, the MISFETs Q are electrically coupled to the wiring layer M1 by the plugs 6LE as the slit vias extending in the gate width direction of each of the gate electrodes GE included in the MISFETs Q. The plugs 6LE are formed immediately under the opening OP. That is, the plugs 6E overlap the opening OP in plan view.

In such a case, even when parts of the plugs 6LE are deformed when copper wires are bonded to the portion of the pad PD which is exposed from the opening OP, the MISFETs Q can electrically be coupled to the wires 5A via the other portions of the plugs 6LE. Accordingly, even when the plugs 6LE are formed immediately under the opening OP, it is possible to prevent or inhibit a defect from occurring in the coupling between the MISFETs Q and the wires 5A. That is, when the plugs 6LE as the slit vias overlap the opening OP in plan view, it is possible to prevent or inhibit a defect from occurring in the coupling between the MISFETs Q and the wires 5A.

Preferably, in Embodiment 2, each of the gate electrodes GE is made of a metal film. That is, the gate electrode GE is a metal gate. In such a case, it is possible to reduce fluctuations in threshold voltage when the gate insulating film GI made of a High-k film, i.e., a high-dielectric-constant film having a relative permittivity higher than the relative permittivity of, e.g., silicon nitride (SiN) is used. As a result, when the gate insulating film GI made of the High-k film is used, the inherently expected effect of reducing a gate leakage current can easily be achieved.

As the metal film included in each of the gate electrodes GE, a metal film made of a titanium nitride (TiC) film, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a tungsten (W) film, or the like can be used.

When the gate electrodes GE are metal gates, the gate electrodes GE are preferably formed by the process of forming the source regions SR and the drain regions DR and then forming the gate electrodes GE., i.e., a gate last process, as will be described later using FIGS. 24 and 25. This allows the plugs 6LE extending in the gate width direction of each of the gate electrodes GE, i.e., the Y-axis direction to be easily formed.

In Embodiment 2, the MISFETs Q preferably include fins FN each made of a semiconductor region having a cubic shape and formed over the upper surface of the substrate 1. In other words, the MISFETs Q are fin-type field effect transistors. This can reduce the area of the region where each of the MISFETs Q is formed and allow higher integration of the semiconductor device. In addition, since the fins FN extend, the mobility of carriers can be improved under the strain effect of the extending fins FN.

Note that the fins FN may also be formed not directly over the upper surface of the substrate 1, but on the upper surface side of the substrate 1. That is, it is sufficient for the fins FN to be formed over the upper surface of the substrate 1.

In plan view, the fins FN extend in the X-axis direction as the gate length direction of each of the gate electrodes GE. The gate electrodes GE are placed over the fins FN and over the upper surface of the substrate 1 via the gate insulating films GI to extend in the Y-axis direction in plan view. That is, in plan view, the gate electrodes GE cross the fins FN.

At this time, the source region SR is formed also in the portion of the fin FN which is located on one side of any of the gate electrodes GE in the X-axis direction, while the drain region DR is formed also in the portion of the fin FN which is located opposite to the one side of the gate electrode GE in the X-axis direction, i.e., on the other side. As described above, the plugs 6LE are formed over the source region SR or the drain region DR. That is, the plugs 6LE also cross the fins FN in plan view, similarly to the gate electrodes GE.

As described above, a consideration will be given to the case where each the MISFETs Q is an n-channel field effect transistor. In such a case, as shown in FIGS. 20 to 23, the drain region DR of the MISFET Q is electrically coupled to the power supply voltage wire 5AP (see FIG. 7) via the plugs 6LE and 6A and the source region SR of the MISFET Q is electrically coupled to the reference-potential wire 5AG (see FIG. 7) via the plugs 6LE and 6A.

On the other hand, the gate electrode GE of the MISFET Q is electrically coupled to the reference-potential wire 5AG (see FIG. 7). That is, the potential of each of the gate electrode GE and the source region SR of the MISFET Q is a ground potential. This allows the MISFET Q to be used as an ESD protective circuit.

Note that, in Embodiment 2, each of the MISFETs Q may also be the planar-type field effect transistor described in Embodiment 1, not the fin-type field effect transistor. Also, in Embodiment 2, the gate electrode GE of the MISFET Q may also be the gate made of, a polysilicon film described in Embodiment 1, not the metal gate.

<Manufacturing Process of Semiconductor Device>

The manufacturing process of the semiconductor device in Embodiment 2 can be the same as the manufacturing process of the semiconductor device in Embodiment 1 except that the MISFETs Q are coupled to the wires 5A via the plugs 6LE extending in the gate width direction of each of the MISFETs Q.

Also, in the manufacturing process of the semiconductor device in Embodiment 2, as described above, when the gate electrodes GE as the metal gates of the MISFETs Q are formed by the gate last process, the plugs 6LE as the slit vias can be formed. The following will describe a method of forming the gate electrodes GE and the plugs 61E by the gate last process with reference to FIGS. 24 and 25.

Figure 24:
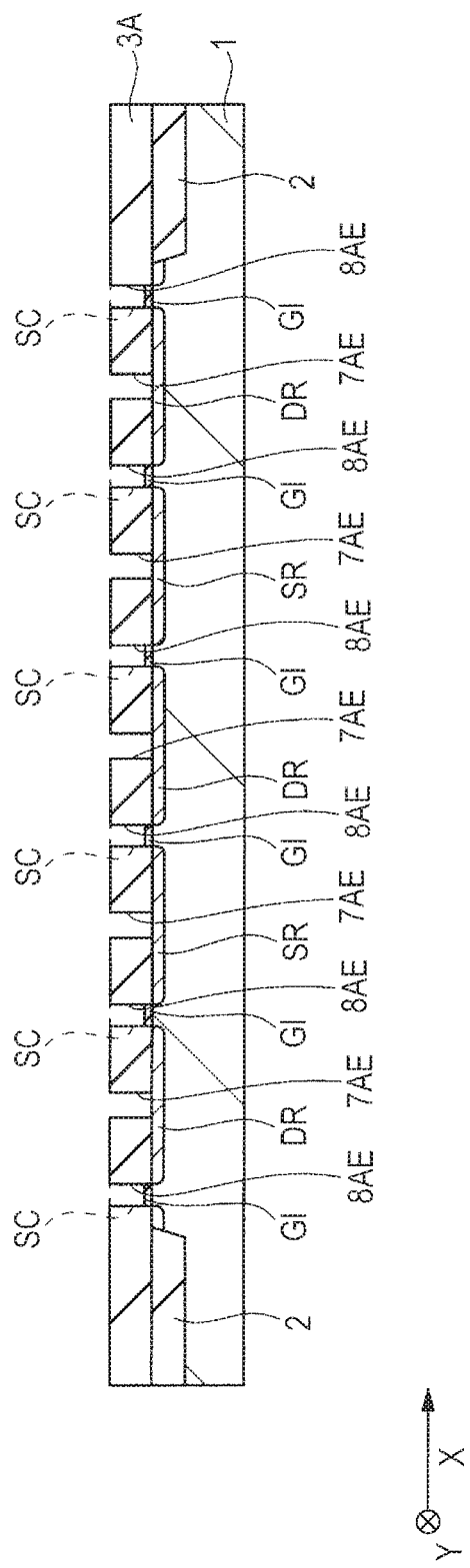
FIG. 24 is a main-portion cross-sectional view of the semiconductor device in Embodiment 2 during the manufacturing process thereof.
Figure 25:
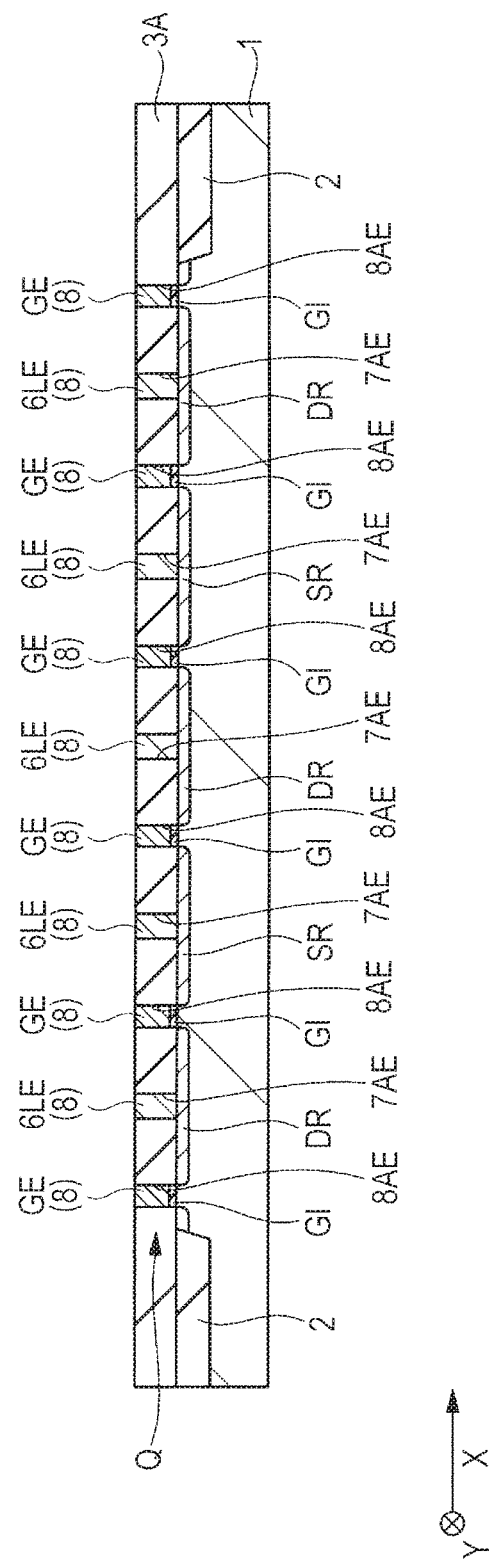
FIG. 25 is a main-portion cross-sectional view of the semiconductor device in Embodiment 2 during the manufacturing process thereof.

FIGS. 24 and 25 are main-portion cross-sectional views of the semiconductor device in Embodiment 2 during the manufacturing process thereof. FIGS. 24 and 25 are cross-sectional views along the line A-A in FIG. 23.

As shown in FIG. 24, in the gate last process, for example, electrodes SC each made of a polysilicon film and extending in the Y-axis direction in plan view are formed over the upper surface of the substrate 1 via the gate insulating films GI. Then, in the upper-layer portions of the substrate 1 which are located on both sides of the electrodes SC, the source regions SR and the drain regions DR are formed. Then, over the upper surface of the substrate 1, the insulating film 3A is formed so as to cover the electrodes SC. Then, after the upper surface of the insulating film 3A is polished to expose the upper surfaces of the electrodes SC, the electrodes SC are partially removed to form trench portions 8AE extending through the insulating film 3A and reaching the gate insulating films GI. The trench portions 8AE extend in the Y-axis direction in plan view.

When the trench portions 8AE extending through the insulating film 3A and reaching the gate insulating films GI are formed, as shown in FIG. 24, trench portions 7AE each extending through the insulating film 3A and reaching the source region SR or the drain regions DR are formed. In plan view, the trench portions 7AE extend in the Y-axis direction.

Next, as shown in FIG. 25, the gate electrodes GE each made of a metal film are formed so as to be embedded in the trench portions 8AE. First, a metal film 8 such as a titanium nitride (TiN) film described above is deposited so as to be embedded in the trench portions 8AE. Next, the portion of the metal film 8 which is located outside the trench portions 8AE is removed by a CMP method to thus form the gate electrodes GE made of the metal film 8 embedded in the trench portions SAE. Since the trench portions 8AE extend in the Y-axis direction, the gate electrodes GE made of the metal film 8 embedded in the trench portions SAE also extend in the Y-axis direction.

Also, when the metal film 8 is deposited so as to be embedded in the trench portions 8AE, the metal film 8 is deposited so as to be embedded in the trench portions 7AE. Next, when the portion of the metal film 8 which is located outside the trench portions 8AE is removed by a CMP method, the portion of the metal film 8 which is located outside the trench portions 7AE is removed to form the plugs 6LE made of the metal film 8 embedded in the trench portions 7AE, as shown in FIG. 25. Since the trench portions 7AE extend in the Y-axis direction, the plugs 6LE made of the metal film 8 embedded in the trench portions 7AE also extend in the Y-axis direction.

When the gate electrodes GE are thus formed by the gate last process, the trench portions 7AE each extending through the insulating film 3A and reaching the source region SR or the drain region DR can be formed, as shown in FIG. 24, and the plugs 6LE made of the metal film can be formed so as to be embedded in the trench portions 7AE, as shown in FIG. 25. This allows the plugs 6LE extending in the gate width direction of each of the gate electrodes GE, i.e., in the Y-axis direction to be easily formed.

Note that the step of forming the trench portions 7AE may also be performed as a step different from the step of forming the trench portions 8AE.

<Main Characteristic Features and Effects of Embodiment 2>

In Embodiment 2 also, in the same manner as in Embodiment 1, any of the MISFETs Q overlaps the opening OP in plan view, any of the wires 5A overlaps the opening OP in plan view, and any of the wires 5B overlaps the opening OP in plan view, while none of the plurality of plugs 6B overlaps the opening OP in plan view. In addition, any of the wires 50 overlaps the opening OP in plan view, while none of the plurality of plugs 6C overlaps the opening OP in plan view and none of the plurality of plugs 6H overlaps the opening OP in plan view.

That is, in Embodiment 2 also, in the same manner as in Embodiment 1, none of the plurality of plugs 6B, 6C, and 6H each coupling different two of the plurality of wiring layers to each other overlaps the opening OP in plan view.

Accordingly, the semiconductor device in Embodiment 2 also has the same effect as that of the semiconductor device in Embodiment 1. That is, even when a stress is applied to the portion of the pad PD which is exposed from the opening OP in plan view upon the bonding of copper wires to the portion of the pad PD which is exposed from the opening OP, it is possible to prevent or inhibit the plugs each coupling different two wiring layers from being deformed. As a result, it is possible to prevent or inhibit a defect from occurring in the coupling between different two wiring layers. This allows the performance of the semiconductor device to be improved.

On the other hand, unlike the plugs 6L in Embodiment 1, the plugs 6LE in Embodiment 2 extend in the Y-axis direction as the gate width direction of each of the gate electrodes GE in plan view. Accordingly, even when parts of the plugs 6LE are deformed upon the bonding of the copper wires to the portion of the pad PD which is exposed from the opening OP, it is possible to electrically couple the MISFETs Q to the wires 5A via the other portions of the plugs LE. As a result, even when the plugs 6LE overlap the opening OP in plan view, it is possible to prevent or inhibit a defect from occurring in the coupling between the MISFETs Q and the wires 5A.

While the invention achieved by the present inventors has been specifically described heretofore on the basis or the embodiments thereof, the present invention is not limited to the foregoing embodiments. It will be appreciated that various changes and modifications can be made in the invention within the scope not departing from the gist thereof.

What is claimed is:

1. A semiconductor device, comprising:
   a semiconductor substrate;
   a semiconductor element formed in a main surface of the semiconductor substrate;
   a plurality of wiring layers stacked over the main surface of the semiconductor substrate; and
   a plurality of first coupling electrodes each of which couples different two of the wiring layers to each other,
   wherein the one of the wiring layers which is located under the uppermost wiring layer includes a first wire,
   wherein the uppermost one of the wiring layers includes:
   an electrode terminal;
   an insulating film formed over the electrode terminal; and
   an opening extending through the insulating film and reaching the electrode terminal,
   wherein the semiconductor element and the first wire overlap the opening in plan view, wherein the plurality of wiring layers comprise all wiring layers between the opening and the main surface of the semiconductor substrate,
wherein the plurality of first coupling electrodes comprise all coupling electrodes that couple any one of the plurality of wiring layers with another one of the plurality of wiring layers; and
wherein none of the plurality of first coupling electrodes overlaps the opening in plan view.

2. A semiconductor device, comprising:
a semiconductor substrate;
a semiconductor element formed in a main surface of the semiconductor substrate;
a plurality of wiring layers stacked over the main surface of the semiconductor substrate;
a plurality of first coupling electrodes each of which couples different two of the wiring layers to each other; and
a plurality of second coupling electrodes which couple the lowermost one of the wiring layers to the semiconductor element,
wherein the one of the wiring layers which is located under the uppermost wiring layer includes a first wire,
wherein the uppermost one of the wiring layers includes:
an electrode terminal;
an insulating film formed over the electrode terminal; and
an opening extending through the insulating film and reaching the electrode terminal,
wherein the semiconductor element and the first wire overlap the opening in plan view,
wherein none of the first coupling electrodes overlaps the opening in plan view,
wherein the semiconductor element is a first field effect transistor,
wherein the first field effect transistor includes a first source region and a first drain region,
wherein each of the second coupling electrodes couples the lowermost wiring layer to the first source region or the first drain region, and
wherein none of the second coupling electrodes overlaps the opening in plan view.

3. The semiconductor device according to claim 1, further comprising:
a third coupling electrode which couples the lowermost one of the wiring layers to the semiconductor element,
wherein the semiconductor element is a second field effect transistor,
wherein the second field effect transistor includes a gate electrode, a second source region, and a second drain region,
wherein the third coupling electrode couples the lowermost wiring layer to the second source region or the second drain region, and
wherein the third coupling electrode extends in a first direction as a gate width direction of the gate electrode and overlaps the opening in plan view.

4. The semiconductor device according to claim 3,
wherein the second field effect transistor includes a fin made of a semiconductor region formed over the main surface of the semiconductor substrate and having a cubic shape,
wherein, in plan view, the fin extends in a second direction as a gate length direction of the gate electrode,
wherein the gate electrode is placed over the fin via a first gate insulating film and extends in the first direction in plan view,
wherein the second source region is formed in a portion of the fin which is located on a first side of the gate electrode,
wherein the second drain region is formed in a portion of the fin which is located on a side of the gate electrode opposite to the first side, and
wherein the third coupling electrode is formed over the second source region or the second drain region.

5. A semiconductor device, comprising:
a semiconductor substrate;
a semiconductor element formed in a main surface of the semiconductor substrate;
a plurality of wiring layers stacked over the main surface of the semiconductor substrate; and
a plurality of first coupling electrodes each of which couples different two of the wiring layers to each other,
wherein the one of the wiring layers which is located under the uppermost wiring layer includes a first wire,
wherein the uppermost one of the wiring layers includes:
an electrode terminal;
an insulating film formed over the electrode terminal; and
an opening extending through the insulating film and reaching the electrode terminal,
wherein the semiconductor element and the first wire overlap the opening in plan view,
wherein none of the first coupling electrodes overlaps the opening in plan view,
wherein the one of the wiring layers which is located under the uppermost layer includes a plurality of the first wires,
wherein each of the first wires overlaps the opening in plan view,
wherein, in plan view, a ratio of a total area of portions of the opening which individually overlap the first wires to an area of the opening is 1 to 50%,
wherein a width of each of the first wires is less than 1 μm, and
wherein a thickness of the electrode terminal is not more than 3 μm.

6. The semiconductor device according to claim 1,
wherein, to a portion of the electrode terminal which is exposed in the opening, a copper wire is bonded.

7. The semiconductor device according to claim 1,
wherein the electrode terminal is made of aluminum,
wherein the first wire is made of copper, and
wherein the first coupling electrodes are each made of copper.

8. The semiconductor device according to claim 5,
wherein the electrode terminal is made of aluminum,
wherein the first wires are each made of copper, and
wherein the first coupling electrodes are each made of copper.

9. The semiconductor device according to claim 3,
wherein the gate electrode is made of a metal film.

* * * * *